United States Patent
Nishizawa et al.

(10) Patent No.: US 9,276,216 B2
(45) Date of Patent: Mar. 1, 2016

(54) ORGANIC MOLECULAR DEVICE

(71) Applicant: Kabushiki Kaisha Toshiba, Minato-ku (JP)

(72) Inventors: Hideyuki Nishizawa, Tokyo (JP); Shigeki Hattori, Kanagawa (JP); Yusuke Tanaka, Kanagawa (JP); Koji Asakawa, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 137 days.

(21) Appl. No.: 14/196,265

(22) Filed: Mar. 4, 2014

(65) Prior Publication Data

US 2015/0069337 A1 Mar. 12, 2015

Related U.S. Application Data

(60) Provisional application No. 61/875,889, filed on Sep. 10, 2013.

(51) Int. Cl.
*H01L 51/30* (2006.01)
*H01L 51/00* (2006.01)
(Continued)

(52) U.S. Cl.
CPC .......... *H01L 51/005* (2013.01); *G11C 13/0014* (2013.01); *G11C 13/0016* (2013.01);
(Continued)

(58) Field of Classification Search
CPC ............ H01L 51/0035; H01L 51/0036; H01L 51/0098; G11C 13/0016
See application file for complete search history.

(56) References Cited

U.S. PATENT DOCUMENTS

| | | | |
|---|---|---|---|
| 7,629,606 B2 * | 12/2009 | Matsui | B82Y 10/00 257/40 |
| 7,799,598 B2 * | 9/2010 | Kuhr | B82Y 10/00 438/99 |

(Continued)

FOREIGN PATENT DOCUMENTS

| | | |
|---|---|---|
| JO | 2012-204434 | 10/2012 |
| JP | 2006-245549 | 9/2006 |

(Continued)

OTHER PUBLICATIONS

J. Lambe, et al., "Molecular Vibration Spectra by Inelastic Electron Tunneling", Physical Review, vol. 165, No. 3, Jan. 15, 1968, pp. 821-832.

(Continued)

*Primary Examiner* — Evan Pert
(74) *Attorney, Agent, or Firm* — Oblon, McClelland, Maier & Neustadt, L.L.P

(57) ABSTRACT

An organic molecular device of an embodiment includes a first and a second conductive layers and an organic molecular layer having an organic molecule provided between the first and the second conductive layer. The organic molecule includes a one-dimensional or quasi one-dimensional π-conjugated system chain having either a first aromatic ring or a second aromatic ring. The first aromatic ring has one or more substituents that are an electron withdrawing group, each substituent of the first aromatic ring is independently selected from the group consisting of the electron withdrawing group and hydrogen, the second aromatic ring has one or more substituents that are an electron releasing group, and each substituent of the second aromatic ring is independently selected from the group consisting of the electron releasing group and hydrogen. The first aromatic ring or the second aromatic ring exist in an unbalanced manner in the π-conjugated system chain.

22 Claims, 22 Drawing Sheets

(51) Int. Cl.
*G11C 13/00* (2006.01)
*H01L 51/05* (2006.01)

(52) U.S. Cl.
CPC ........ *H01L51/0035* (2013.01); *H01L 51/0036* (2013.01); *H01L 51/0098* (2013.01); *G11C 2213/77* (2013.01); *H01L 51/0595* (2013.01)

(56) References Cited

U.S. PATENT DOCUMENTS

| | | | |
|---|---|---|---|
| 8,319,208 B2* | 11/2012 | Sorenson | H01L 51/0591 257/40 |
| 8,691,392 B2* | 4/2014 | Wessels | B82Y 10/00 156/182 |
| 8,698,132 B2* | 4/2014 | Masui | B82B 1/00 257/40 |
| 2006/0208252 A1 | 9/2006 | Wessels et al. | |
| 2008/0087887 A1 | 4/2008 | Cho et al. | |
| 2008/0224131 A1 | 9/2008 | Zhang et al. | |
| 2012/0241713 A1 | 9/2012 | Nishizawa et al. | |
| 2014/0008601 A1 | 1/2014 | Nishizawa et al. | |

FOREIGN PATENT DOCUMENTS

| | | |
|---|---|---|
| JP | 2008-103708 | 5/2008 |
| JP | 2008-513543 | 5/2008 |
| JP | 2012-204433 | 10/2012 |
| WO | 2012/127863 A1 | 9/2012 |

OTHER PUBLICATIONS

Arieh Aviram, et al., "Molecular Rectifiers", Chemical Physics Letters, vol. 29, No. 2, Nov. 15, 1974, pp. 277-283.

J. L. Brédas, et al., "Comparative theoretical study of the doping of conjugated polymers: Polarons in polyacetylene and polyparaphenylene", Physical Review B, vol. 26, No. 10, Nov. 15, 1985, pp. 5843-5854.

Robert M. Metzger, et al., "Unimolecular Electrical Rectification in Hexadecylquinolinium Tricyanoquinodimethanide", J. Am. Chem. Soc., vol. 119, No. 43, 1997, pp. 10455-10466.

Andrei Honciuc, et al., "Current Rectification in a Langmuir-Schaefer Monolayer of Fullerene-bis[4-diphenylamino-4"-(N-ethyl-N-2"-ethyl)amino-1,4-diphenyl-1,3-butadiene] Malonate between Au Electrodes", J. Phys. Chem. B, vol. 109, No. 2, 2005, pp. 857-871.

* cited by examiner

ORGANIC MOLECULAR DEVICE

CROSS-REFERENCE TO RELATED APPLICATION

This application is based upon and claims the benefit of priority from U.S. Provisional Application No. 61/875,889, filed on Sep. 10, 2013, the entire contents of which are incorporated herein by reference.

FIELD

Embodiments described herein relate generally to an organic molecular device.

BACKGROUND

In order to scale down electronic devices such as a memory device and a logic device, it has been proposed to use an organic molecule. The organic molecule can organically synthesize a variety of molecular structures and substituent groups. Since it can thus impart desired electrochemical properties and its constitutional unit is small, it may make it possible to scale down the electronic devices. A rectification device using the organic molecule has been studied. For example, there has been reported rectification of a device obtained by interposing between electrodes a molecule D-σ-A formed by bridging between an electron releasing part (donor part) D having a small ionized potential and an electron withdrawing part (acceptor part) A having a high electron affinity by an insulating covalent bond. Further, there has been reported rectification of a device obtained by interposing between electrodes a molecule T-D-π-A formed by replacing the above bridged portion with a short π electron and bonding an insulating alkyl chain (tail) T to D.

DETAILED DESCRIPTION

Figure 1:
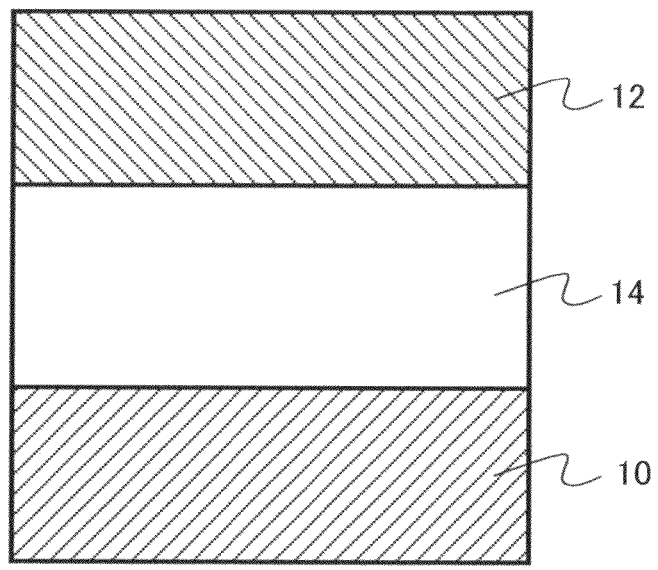
FIG. 1 is a schematic sectional view of an organic molecular device of a first embodiment.

An organic molecular device of an embodiment includes a first conductive layer, a second conductive layer; and an organic molecular layer provided between the first conductive layer and the second conductive layer and provided with an organic molecule. The organic molecule including a one-dimensional or quasi (pseudo) one-dimensional π-conjugated system chain, the π-conjugated system chain has either a first aromatic ring or a second aromatic ring. The first aromatic ring has one or more substituents that are an electron withdrawing group (electron acceptor group), each substituent of the first aromatic ring is independently selected from the group consisting of the electron withdrawing group and hydrogen. The second aromatic ring has one or more substituents that are an electron releasing group (electron donor group), and each substituent of the second aromatic ring is independently selected from the group consisting of the electron releasing group and hydrogen. The first aromatic ring or the second aromatic ring exist in an unbalanced manner in the π-conjugated system chain. The first aromatic ring or the second aromatic ring exist in an unbalanced manner in the π-conjugated system chain.

In the present specification, the aromatic ring (first aromatic ring) bonded only with the electron withdrawing group out of the electron withdrawing group and the electron releasing group is also called an electron withdrawing part (acceptor part) A. Further, the aromatic ring (second aromatic ring) bonded only with the electron releasing group out of the electron withdrawing group and the electron releasing group is also called an electron releasing part (donor part) D.

Moreover, the "resistance change-type molecular chain" in the present specification means a molecular chain provided with the function of changing resistance due to the presence or absence of an electric field or injection of a charge.

Furthermore, the "chemical bond" in the present specification is a concept indicating any of a covalent bond, an ionic bond and a metallic bond, as well as a concept excluding a hydrogen bond and a bond by Van der Waals force.

Further, the "one-dimensional π-conjugated system chain" is a molecular chain where single and multiple bonds are alternately located in a one-dimensional manner. For example, it is a molecular chain made up of carbon bonds of "single bond-triple bond-single bond". Moreover, the "quasi one-dimensional π-conjugated system chain" is a molecular chain where alternately located single and multiple bonds are branched. For example, biphenyl where two benzene rings are linked by a single bond corresponds thereto.

Hereinafter, embodiments will be described with reference to the drawings.

First Embodiment

An organic molecular device of the present embodiment is provided with a first conductive layer, a second conductive layer and an organic molecular layer. The organic molecular layer is provided between the first conductive layer and the second conductive layer. The organic molecular layer is provided with an organic molecule. The organic molecule includes a one-dimensional or quasi one-dimensional π-conjugated system chain. The π-conjugated system chain has a first aromatic ring. The first aromatic ring has one or more substituents that are an electron withdrawing group, each substituent of the first aromatic ring is independently selected from the group consisting of the electron withdrawing group and hydrogen. The first aromatic ring exist in an unbalanced manner in the π-conjugated system chain.

The organic molecular device of the present embodiment is a diode having rectification characteristics. With the above configuration, the organic molecular device of the present embodiment can realize stable rectification characteristics while having a small size of not larger than 20 nm, for example.

FIG. 1 is a schematic sectional view of the organic molecular device of the present embodiment. It is provided with a first conductive layer 10, a second conductive layer 12 and an organic molecular layer 14. The organic molecular layer 14 is provided between the first conductive layer 10 and the second conductive layer 12.

The first conductive layer 10 and the second conductive layer 12 are, for example, electrodes formed of metal. Other than metal, a conductor such as a semiconductor, a metal-semiconductor compound, a metal oxide or the like can be applied. The first conductive layer 10 and the second conductive layer 12 are, for example, not smaller than 1 nm and not larger than 20 nm both in width and thickness.

Figure 2:
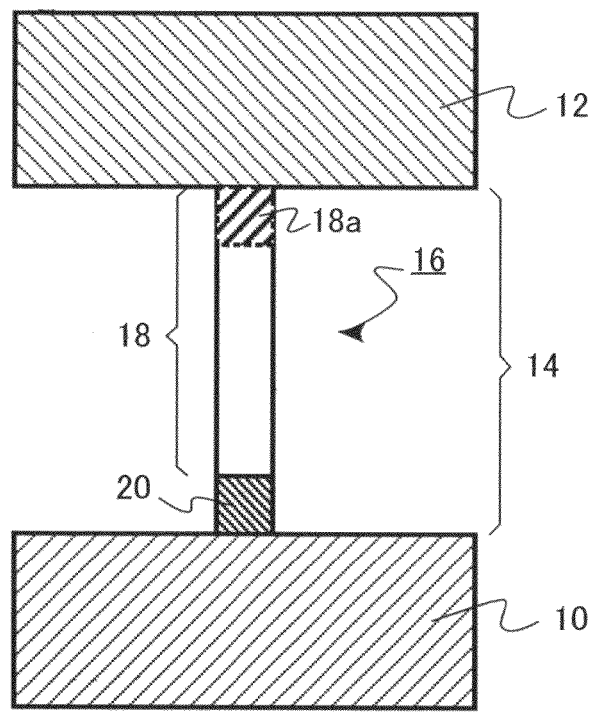
FIG. 2 is a schematic sectional view showing a structure in an organic molecular layer of the first embodiment.

FIG. 2 is a schematic sectional view showing a structure in the organic molecular layer of the present embodiment. A thickness of the organic molecular layer 14 is, for example, not smaller than 1 nm and not larger than 10 nm. The thickness of the organic molecular layer 14 is equal to a distance between the first conductive layer 10 and the second conductive layer 12.

The organic molecular layer 14 is made up of a plurality of organic molecules 16. FIG. 2 shows only one organic molecule 16 for convenience' sake. The organic molecular layer 14 is, for example, a self-assembled monolayer (SAM) of the organic molecule 16.

The organic molecule 16 includes a one-dimensional or quasi one-dimensional π-conjugated system chain 18. The π-conjugated system chain 18 only has an aromatic ring 18a bonded only with an electron withdrawing group out of: an aromatic ring (first aromatic ring) bonded only with an electron withdrawing group out of an electron withdrawing group and an electron releasing group; and an aromatic ring (second aromatic ring) bonded only with an electron releasing group out of an electron withdrawing group and an electron releasing group. This aromatic ring 18a exists in an unbalanced manner in the π-conjugated system chain 18.

The organic molecule 16 is provided with a linker moiety 20 for binding the π-conjugated system chain 18 to the first conductive layer 10. Here, the linker moiety 20 means a region for binding the molecule to the electrode (conductive layer) by a chemical bond. The organic molecule 16 is bound to the first conductive layer 10 via a linker moiety 20.

In the organic molecule 16 of the present embodiment, the electron withdrawing part A exists in an unbalanced manner, and the organic molecule 16 thus forms a π-A structure. This structure leads to formation of a potential by a dipole in the organic molecule 16. With this potential, the organic molecular device functions as a diode having a rectification characteristic.

Further, the electron releasing part D does not exist in the organic molecule 16. An ion pair is thus not generated in the organic molecule 16. Hence deterioration in characteristics due to moisture or the like does not tend to occur. This allows realization of a diode with stable characteristics.

Further, image force is generated between a charge in the organic molecule 16 and an image charge generated in the first conductive layer 10 and the second conductive layer 12 which interpose the organic molecule 16 therebetween. With this image force, the potential formed by the dipole increases, to enhance a rectification characteristic. Especially when the organic molecule 16 has a small length, image force which inversely proportional to a square of a distance between the charges increases, to significantly improve the rectification characteristic.

Figure 3:
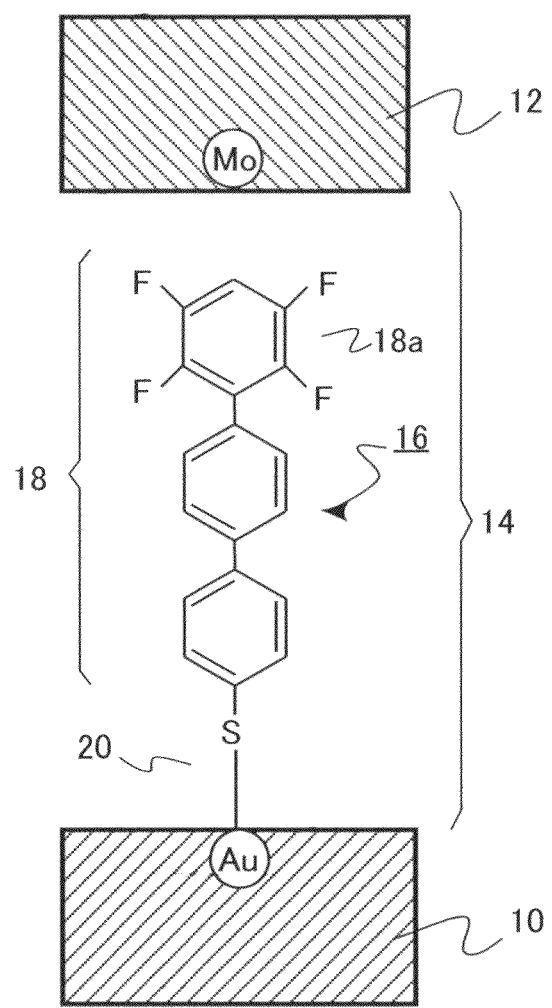
FIG. 3 is a schematic sectional view showing a specific example of the organic molecular device of the first embodiment.
Figure 4A:
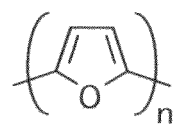
FIGS. 4A to 4F are diagrams each exemplifying a molecular structure of a π-conjugated system chain of the first embodiment.
Figure 4B:
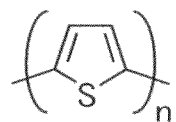
Figure 4C:
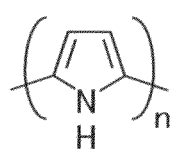
Figure 4D:
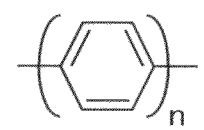
Figure 4E:
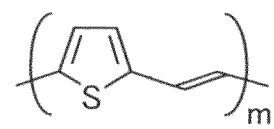
Figure 4F:
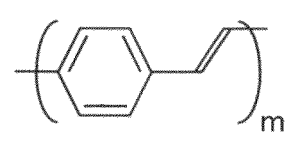

FIG. 3 is a schematic sectional view showing a specific example of the organic molecular device of the present embodiment. The first conductive layer 10 as a lower electrode is, for example, gold (Au). Further, the second conductive layer 12 as an upper electrode is, for example, molybdenum (Mo).

The organic molecule 16 is provided with the π-conjugated system chain 18 where three phenyl rings are bonded by single bonds. A thiol group exists as the linker moiety 20 at one end of the π-conjugated system chain 18, and a sulfur atom (S) is chemically bonded with a gold atom (Au) on the surface of the first conductive layer 10.

The phenyl ring at the end on the second conductive layer 12 side of the three phenyl rings is bonded with the fluorine atom (F) as the electron withdrawing group. This phenyl ring at the end corresponds to the aromatic ring (first aromatic ring) 18a bonded only with the electron withdrawing group. Since the phenyl ring not at the center but the one at the end out of the three phenyl rings is the first aromatic ring, the first aromatic ring exists in an unbalanced position in the π-conjugated system chain 18.

From the viewpoint of chemical bond easiness, a desirable material for the conductive layer varies depending on the structure of the linker moiety 20. For example when one end is the thiol group as in FIG. 3, the electrode (conductive layer) on the chemically bonded side is desirably gold (Au), silver (Ag), copper (Cu), tungsten (W), tungsten nitride ($WN_2$) tantalum nitride (TaN) or titanium nitride (TiN). In particular, the electrode is desirably gold (Au), silver (Ag) or tungsten (W), which particularly tends to form a chemical bond among the above materials.

Further, for example when one end is an alcohol group, a carboxyl group or a phosphate group, the electrode (conductive layer) on the chemically bonded side is desirably tungsten (W), tungsten nitride ($WN_2$), tantalum (Ta), tantalum nitride (TaN), molybdenum (Mo), molybdenum nitride (MoN) or titanium nitride (TiN). In particular, the electrode is desirably tantalum (Ta), tantalum nitride (TaN), molybdenum nitride (MoN) or titanium nitride (TiN), which particularly tends to form a chemical bond among the above materials.

Moreover, for example when one end is a silanol group, the electrode (conductive layer) on the chemically bonded side is desirably silicon (Si) or a metal oxide.

Furthermore, from the viewpoint of improving the rectification characteristic of the diode, a work function of the first conductive layer 10 is desirably larger than a work function of the second conductive layer 12.

FIGS. 4A to 4F are diagrams each exemplifying a molecular structure of the π-conjugated system chain 18. In the figures, n is desirably an integer not smaller than 3 and not larger than 10. Further, in the figures, m is desirably an integer not smaller than 2 and not larger than 7.

For example, part of the aromatic ring in the π-conjugated system chain 18 shown in each of FIGS. 4A to 4F is bonded with the electron withdrawing group, to give the electron withdrawing part A.

The number of carbon atoms in the π-conjugated system chain 18 which are one-dimensionally bonded by alternate single bonds and double bonds is desirably not smaller than 12 and not larger than 40. When the number of carbon atoms is smaller than 12, carriers flow in the organic molecule 16 by tunneling, which might cause the rectification characteristic not to occur. When the number exceeds 40, a moving velocity of the carriers decreases, which might cause a current amount to decrease.

From the viewpoints of the stability and production easiness of the organic molecule 16, the π-conjugated system chain 18 is preferably made up of the phenyl ring. Further, from the viewpoint of realizing a proper rectification characteristic and a proper current amount, the number of phenyl rings is desirably not smaller than three and not larger than five. At this time, from the viewpoint of increasing the current amount, the phenyl rings are desirably bonded with each other by a single bond.

FIGS. 5A to 5E are diagrams each exemplifying a molecular structure of the aromatic ring 18a bonded only with the electron withdrawing group, namely the electron withdrawing part (acceptor part) A. In the figures, $X_A$ is, for example, a fluorine atom (F), a chloride atom (Cl), a bromine atom (Br), a nitro group, a cyano group, a hydroxyl group, a carbonyl group or a carboxyl group. From the viewpoint of forming the organic molecule 16 with a stable structure, it is desirably the fluorine atom (F).

Figure 5A:
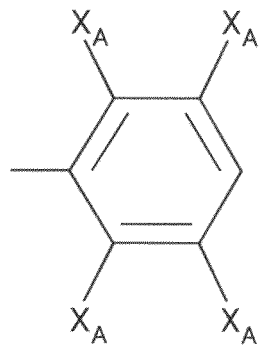
FIGS. 5A to 5E are diagrams each exemplifying a molecular structure of an aromatic ring bonded only with an electron withdrawing group in the first embodiment.
Figure 5B:
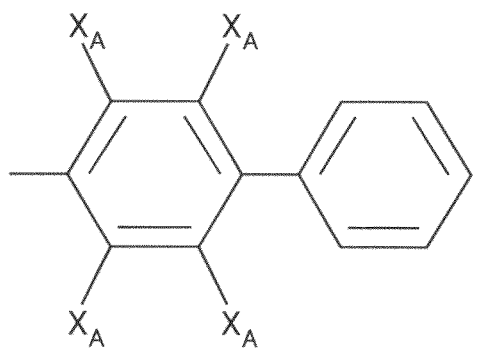
Figure 5C:
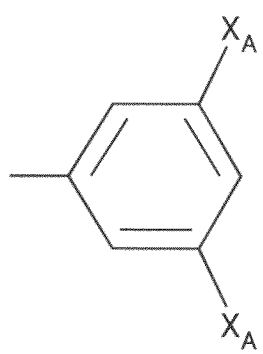
Figure 5D:
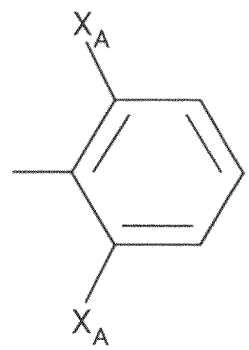
Figure 5E:
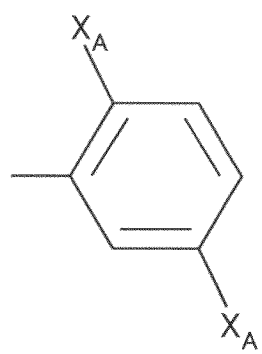
Figure 6A:
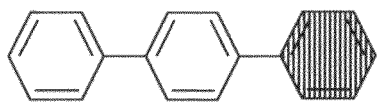
FIGS. 6A to 6K are diagrams each explaining an arrangement of the aromatic ring bonded only with the electron withdrawing group in the first embodiment.
Figure 6B:
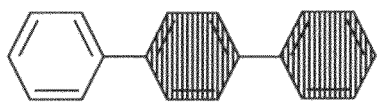
Figure 6C:
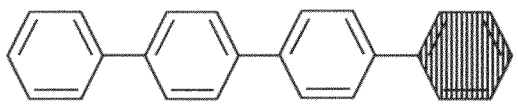
Figure 6D:
Figure 6E:
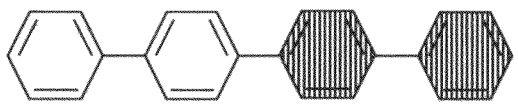
Figure 6F:
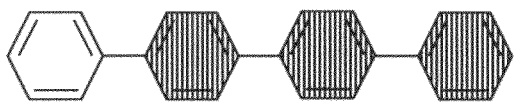
Figure 6G:
Figure 6H:
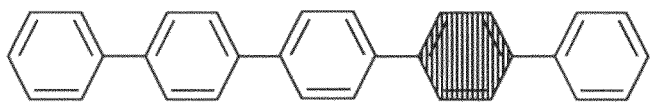
Figure 6I:
Figure 6J:
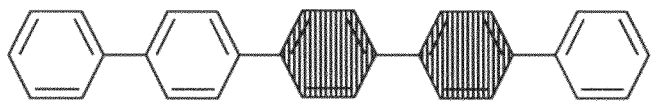
Figure 6K:
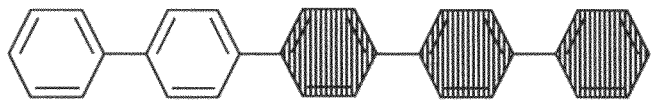

In addition, from the viewpoint of forming an effective dipole in the organic molecule 16, the electron withdrawing group bonded to the aromatic ring 18a is desirably arranged symmetrically about a line through a bonding direction of the π-conjugated system chain 18. The bonding direction of the π-conjugated system chain 18 is an extending direction of a main chain of the π-conjugated system chain 18. For example, a direction of a σ bond connected to the aromatic ring 18a is the bonding direction of the π-conjugated system chain 18. From this viewpoint, among the aromatic rings 18a in FIGS. 5A to 5E, those except for the one in FIG. 5E are desired.

In the present embodiment, the aromatic ring 18a bonded only with the electron withdrawing group exists in an unbalanced manner in the π-conjugated system chain 18. Here, "the aromatic ring 18a exists in an unbalanced manner in the π-conjugated system chain 18" means that the aromatic ring 18a is arranged in an unbalanced manner with respect to a center position of a longitudinal direction of the π-conjugated system chain 18.

FIGS. 6A to 6K are diagrams each explaining an arrangement of the aromatic ring 18a bonded only with the electron withdrawing group. The case is exemplified where the π-conjugated system chain 18 is made up of three to five phenyl rings.

In the figure, a hutched phenyl ring shows the aromatic ring 18a bonded only with the electron withdrawing group. As shown in the figure, the aromatic ring 18a is arranged in an unbalanced manner with respect to the center position of the longitudinal direction of the π-conjugated system chain 18. In other words, the aromatic ring 18a is arranged asymmetrically with the center position of the longitudinal direction of the conjugated system chain 18. In addition, although FIGS. 6A to 6K each show an example where the aromatic rings and single bonds are alternately continued, this is naturally not restrictive. For example, the aromatic ring, a single bond, a triple bond and a single bond may be alternately continued. Further, the aromatic ring is not restricted to the phenyl ring.

From the viewpoint of making the distance between the first conductive layer 10 or the second conductive layer 12 and the charge in the aromatic ring 18a shorter to increase the image force, the aromatic ring 18a is desirably located at the end of the π-conjugated system chain 18. That is, the arrangements of FIGS. 6A, 6B, 6C, 6E, 6F, 6G, 6I and 6K are desired.

Hereinafter, characteristics of the organic molecular device of the embodiment will be described. It is to be noted that the following is not only a description of the present embodiment but also a description common for all embodiments in the present specification.

Using the organic molecule for a rectification device makes the device smaller in size. This thus allows, for example, improvement in storage density of a memory device and size reduction in logic operation unit of DDL (Diode-Diode Logic).

In a conventional rectification device, specifically in a semiconductor pn junction diode with a dielectric constant $\in_S$ obtained by joining a p-type semiconductor (acceptor concentration $N_A$, fermi level $E_{FP}$) with an n-type semiconductor (donor concentration $N_D$, fermi level $E_{FN}$), or a Schottky junction diode obtained by joining metal (fermi level $E_{FM}$) with a semiconductor (ionized impurity concentration $N_S$, fermi level $E_S$, dielectric constant $\in_S$), a spreading width d of a depletion layer on the junction interface which is required for realizing rectification determines the minimum size of the junction direction.

A depletion layer thickness d is given by:

$$d = \sqrt{\frac{2\varepsilon_0 \varepsilon_S}{eN_{e\!f\!f}} V_D}$$

where e is an elementary charge of an electron, and $\varepsilon_0$ is a vacuum dielectric constant.

In the case of the pn junction diode, a junction voltage $V_D$ and an effective impurity concentration $N_{e\!f\!f}$ are given by:

$$V_D = |E_{FP} - E_{FN}|$$

$$N_{e\!f\!f} = \frac{N_A N_D}{N_A + N_D}$$

In the case of the Schottky junction diode, they are given by:

$$V_D = |E_{FM} - E_{FS}|$$

$$N_{e\!f\!f} = N_S$$

Therefore, a condition for obtaining a Schottky barrier diode of silicon (dielectric constant $\varepsilon_S = 11.9$) with a size not larger than 3.0 (nm) and a forward voltage on the order of 0.2 V is that the impurity concentration $N_S$ (cm$^{-3}$) is:

$$N_S \geq \frac{2\varepsilon_0 \varepsilon_S}{ed^2} V_D = 2.9 \times 10^{19}$$

However, a normal rectification effect is not realized with this impurity concentration as it is higher than an impurity concentration ($10^{19}$ (cm$^{-3}$)) of a tunnel diode (Esaki diode) having high impurities. That is, with a molecular size, the rectification effect cannot be obtained by the conventionally known phenomenon.

Thereat, a device has been studied which was obtained by interposing between electrodes a molecule D-σ-A formed by bridging between an electron releasing part (donor part) D having a small ionized potential and an electron withdrawing part (acceptor part) A having a high electron affinity by an insulating covalent bond, and its rectification has been reported. Further, a device has also been studied which was obtained by interposing between electrodes a molecule T-D-π-A formed by replacing the above bridged portion with a short π electron and bonding an insulating alkyl chain T (tail) to D, and its rectification has been reported.

The donor part D tends to accept a hole since it tends to release an electron, but it does not accept an electron. For this reason, the hole flows from the electrode to D, but the electron does not. On the other hand, the acceptor part A tends to accept an electron, but it does not tend to release an electron and does not form a hole. For this reason, the electron flows from the electrode to A, but the hole does not flow. Therefore, a current expresses flowing rectification only in the direction from D to A.

In this mechanism, the donor part D is positively ionized and the acceptor part A is negatively ionized, to form an ion pair such as D$^+$-σ-A$^-$. Such an ion pair tends to attract a water molecule, and thus has a problem of tending to be degraded by moisture. That is, device characteristics might vary under the influence of moisture or the like.

When the organic molecule has a structure of D-σ-A or D-π-A, ionization of the molecule like D$^+$-σ-A$^-$ or D$^+$-π-A$^-$, which becomes a factor of variations in characteristics due to the surrounding environment, is inevitable. The present embodiment expresses rectification by a mechanism different from these structures.

(Cause of Rectification)

The present inventors focused attention on that a molecule has a small size and a molecule is interposed between the electrodes. Then, the present inventors theoretically found that potentials required for charge injection are asymmetrical since the potentials (image force) created by a dipole in the molecule having the π-A structure and mirror image charges in the electrodes are asymmetrical and the asymmetrical potentials formed by the dipole become a barrier of the charge injection even when the charge is injected to the same energy level.

Figure 7:
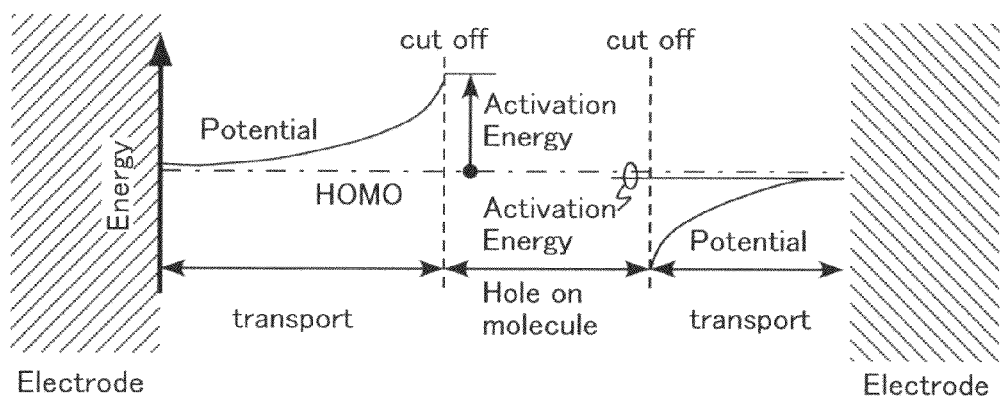
FIG. 7 is a diagram explaining a model for calculating a charge injection barrier.

FIG. 7 is a diagram explaining a model for calculating the charge injection barrier. This illustrates potentials formed by the dipole, activation energy thereby, and activation energy at the time of charge injection by cut-off of the molecule (spatial boundary of a charge inside the molecule and a charge outside the molecule).

Distribution of the potentials including the mirror image charges by the electrodes is calculated from distribution of charges of the molecules fixed in the electrodes (distribution of bonded dipole moments). The distribution of the charges in the molecule (distribution of the bonded dipole moments) is obtained by a molecular orbital method such as Gaussian. It became obvious from an experiment that dominant conduction of a carrier of a diphenyl molecule is conduction of the carrier between the electrodes by tunneling, and the charge does not remain on the molecule. On the other hand, it became obvious that dominant conduction of a carrier of a terphenyl molecule is conduction in which a charge is once injected into the molecule for ionization and the electron then escapes to the opposing electrode.

It is found from this result that the charge injected from the one-side electrode by tunneling stops on the molecule at the time of conducting one or more phenyl rings. That is, the charge needs to exceed a potential from the electrode to the end of the first phenyl ring. Hence the activation energy can be calculated by calculating this potential.

Figure 8:
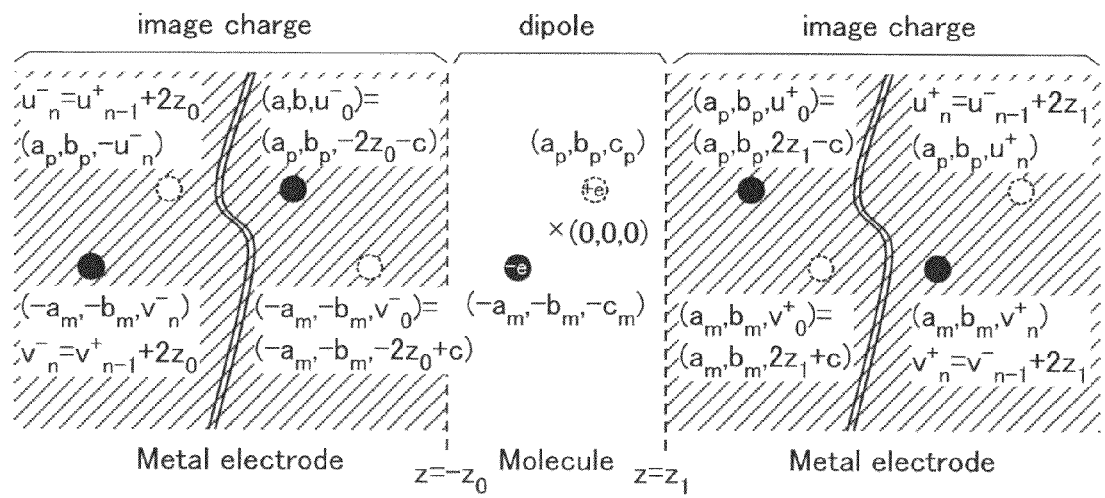
FIG. 8 is a diagram explaining calculation of an image charge by a dipole.

FIG. 8 is a diagram explaining calculation of image charges by the dipole. Hereinafter, there will be described a specific method for calculating potentials by the dipole in the molecule.

Dipole approximation is approximation which holds only when a distance between charges of the dipole is sufficiently small as compared with a distance between a focus position and the dipole. For this reason, a correct result cannot be given by such a system where the image force by the charges of the dipole is considered. Therefore, in order to calculate potentials by the dipole which includes the effect of the image force without performing approximation, the dipole will be represented by two each of positive and negative elementary charges and distances. A position of a charge +e is $(a_p, b_p, c_p)$ and a position of a charge −e is $(a_m, b_m, c_m)$.

The electrodes are present in regions $z=-z_0$ and $z=z_1$, and interpose the dipole therebetween. At this time, when coordinates of image charges by the charges of the dipole which are generated in the negative-side electrode are $(a_p, b_p, -u^-_0)$ (the image charge with respect to the positive charge of the dipole: a sign of the charge is negative) and $(a_m, b_m, -v^-_0)$ (the image charge with respect to the negative charge of the dipole: a sign of the charge is positive) as shown in FIG. 8, $$u_0^- = 2z_0 + c_p$$

$$v_0^- = 2z_0 + c_m$$

is obtained.

Similarly, when coordinates of the image charges by the charges of the dipole which are generated in the positive-side electrode are $(a_p, b_p, u^+_0)$ (the image charge with respect to the positive charge of the dipole: a sign of the charge is negative) and $(a_m, b_m, v^+_0)$ (the image charge with respect to the negative charge of the dipole: a sign of the charge is positive), $$v_0^+ = 2z_1 - c_p$$

$$v_0^+ = 2z_1 - c_m$$

is obtained.

It is to be noted that conditions for existence of the charges of the dipole between the electrodes:

$$-z_0 < \min(c_m, c_p)$$

$$z_1 > \max(c_m, c_p)$$

is formed.

Next, since there exist image charges of the negative-side electrode induced by the image charges at the positions $(a_p, b_p, u^+_0)$ and $(a_m, b_m, v^+_0)$ induced by the positive-side electrode, this effect also needs to be taken in. Generally, when it is assumed that coordinates of image charges induced by the negative-side electrode by image charges at positions $(a_p, b_p, u^+_{n-1})$ and $(a_m, b_m, v^+_{n-1})$ in the positive-side electrode are respectively $(a_p, b_p, -u^-_n)$ and $(a_m, b_m, -v^-_n)$, $$u_n^- = 2z_0 + u_{n-1}^+$$

$$v_n^- = 2z_0 + v_{n-1}^+$$

is obtained.

Similarly, when it is assumed that coordinates of image charges induced by the positive-side electrode by image charges at positions $(a_p, b_p, -u^-_{n-1})$ and $(a_m, b_m, -v^-_{n-1})$ in the negative-side electrode are respectively $(a_p, b_p, u^+_n)$ and $(a_m, b_m, v^+_n)$ $$u_n^+ = 2z_1 + u_{n-1}^-$$

$$v_n^+ = 2z_1 + v_{n-1}^-$$

is obtained.

The above are integrated into:

$$\begin{pmatrix} u_n^- \\ u_n^+ \end{pmatrix} = \begin{pmatrix} 0 & 1 \\ 1 & 0 \end{pmatrix} \begin{pmatrix} u_{n-1}^- \\ u_{n-1}^+ \end{pmatrix} + 2\begin{pmatrix} z_0 \\ z_1 \end{pmatrix}$$

$$\begin{pmatrix} v_n^- \\ v_n^+ \end{pmatrix} = \begin{pmatrix} 0 & 1 \\ 1 & 0 \end{pmatrix} \begin{pmatrix} v_{n-1}^- \\ v_{n-1}^+ \end{pmatrix} + 2\begin{pmatrix} z_0 \\ z_1 \end{pmatrix}$$

These are repeated one more stage:

$$\begin{pmatrix} u_n^- \\ u_n^+ \end{pmatrix} = \begin{pmatrix} u_{n-2}^- \\ u_{n-2}^+ \end{pmatrix} + 2\begin{pmatrix} z_0 + z_1 \\ z_0 + z_1 \end{pmatrix}$$

$$\begin{pmatrix} v_n^- \\ v_n^+ \end{pmatrix} = \begin{pmatrix} v_{n-2}^- \\ v_{n-2}^+ \end{pmatrix} + 2\begin{pmatrix} z_0 + z_1 \\ z_0 + z_1 \end{pmatrix}$$

Since the sign of the image charge changes on each stage, n is divided into an even number and an odd number:

$$\begin{pmatrix} u_{2m}^- \\ u_{2m}^+ \end{pmatrix} = \begin{pmatrix} c_p \\ -c_p \end{pmatrix} + \begin{pmatrix} (2m+2)z_0 + 2mz_1 \\ 2mz_0 + (2m+2)z_1 \end{pmatrix}$$

$$\begin{pmatrix} u_{2m+1}^- \\ u_{2m+1}^+ \end{pmatrix} = \begin{pmatrix} -c_p \\ c_p \end{pmatrix} + \begin{pmatrix} (2m+2)(z_0 + z_1) \\ (2m+2)(z_0 + z_1) \end{pmatrix}$$

$$\begin{pmatrix} v_{2m}^- \\ v_{2m}^+ \end{pmatrix} = \begin{pmatrix} c_m \\ -c_m \end{pmatrix} + \begin{pmatrix} (2m+2)z_0 + 2mz_1 \\ 2mz_0 + (2m+2)z_1 \end{pmatrix}$$

$$\begin{pmatrix} v_{2m+1}^- \\ v_{2m+1}^+ \end{pmatrix} = \begin{pmatrix} -c_m \\ c_m \end{pmatrix} + \begin{pmatrix} (2m+2)(z_0 + z_1) \\ (2m+2)(z_0 + z_1) \end{pmatrix}$$

Considering that the sign is inverted between the original charge and the image charge, positions of charges attributed to the positive charge are $(a_p, b_p, c_p)$ for the original charge, $(a_p, b_p, -u^-_{2m+1})$ and $(a_p, b_p, u^+_{2m+1})$ for the image charges by the original charge, and further, $(a_p, b_p, -u^-_{2m})$ and $(a_p, b_p, u^+_{2m})$ for the inverted image charges. Positions of charges attributed to the negative charge are $(a_m, b_m, -c_m)$ for the original charge, $(a_m, b_m, -v^-_{2m+1})$ and $(a_m, b_m, v^+_{2m+1})$ for the image charges by the original charge, and further, $(a_m, b_m, -v^-_{2m})$ and $(a_m, b_m, v^+_{2m})$ for the inverted image charges.

From the above, a potential $U^+(x, y, z)$ which can be located at a position $(x, y, z)$ by the positive charge is calculated as:

$$U^+(x, y, z) = \frac{e}{4\pi\varepsilon} \frac{1}{\sqrt{(a_p - x)^2 + (b_p - y)^2 + (c_p - z)^2}} +$$

$$\sum_{m=0}^{\infty} \frac{e}{4\pi\varepsilon} \frac{1}{\sqrt{(a_p - x)^2 + (b_p - y)^2 + (u^-_{2m+1} + z)^2}} +$$

$$\sum_{m=0}^{\infty} \frac{e}{4\pi\varepsilon} \frac{1}{\sqrt{(a_p - x)^2 + (b_p - y)^2 + (u^+_{2m+1} - z)^2}} -$$

$$\sum_{m=0}^{\infty} \frac{e}{4\pi\varepsilon} \frac{1}{\sqrt{(a_p - x)^2 + (b_p - y)^2 + (u^-_{2m} + z)^2}} -$$

$$\sum_{m=0}^{\infty} \frac{e}{4\pi\varepsilon} \frac{1}{\sqrt{(a_p - x)^2 + (b_p - y)^2 + (u^+_{2m} - z)^2}}$$

Similarly, a position $U^-(x, y, z)$ which can be located at a position $(x, y, z)$ by the negative charge is calculated as:

$$U^-(x, y, z) = -\frac{e}{4\pi\varepsilon} \frac{1}{\sqrt{(a_m - x)^2 + (b_m - y)^2 + (c_m - z)^2}} -$$

$$\sum_{m=0}^{\infty} \frac{e}{4\pi\varepsilon} \frac{1}{\sqrt{(a_m - x)^2 + (b_m - y)^2 + (v^-_{2m+1} + z)^2}} -$$

$$\sum_{m=0}^{\infty} \frac{e}{4\pi\varepsilon} \frac{1}{\sqrt{(a_m - x)^2 (b_m - y)^2 + (v^+_{2m+1} - z)^2}} +$$

$$\sum_{m=0}^{\infty} \frac{e}{4\pi\varepsilon} \frac{1}{\sqrt{(a_m - x)^2 + (b_m - y)^2 + (v^-_{2m} + z)^2}} +$$

$$\sum_{m=0}^{\infty} \frac{e}{4\pi\varepsilon} \frac{1}{\sqrt{(a_m - x)^2 + (b_m - y)^2 + (v^+_{2m} - z)^2}}$$

From the above, a total potential U(x, y, z) to be calculated is given by:

$$U(x,y,z) = U^+(x,y,z) + U^-(x,y,z)$$

A carrier injected from the outside of the molecule is affected on the potential by the dipole of the molecule. It is thus found that the maximum value of this potential barrier corresponds to activation energy that the carrier needs to exceed.

In order to argue the maximum value of the potential, it is of necessity to clarify whether the carrier is outside the molecule or the inside the molecule. If the distance between the dipole and the carrier can be made shorter without limit, it causes the divergence of a Coulomb potential. In practice, when those are made sufficiently close to each other, they come into a mixed state, and the Coulomb potential is incorporated into a charge rearrangement energy of the state or a polarization energy of the surroundings, to prevent the divergence of the potential from occurring. A distance of the boundary which gives rise to such a state is called a cut-off distance (see FIG. 7).

The cut-off distance in the π-conjugated system chain can be decided by a result of the following experiment. A conductance obtained by a current-voltage characteristic of diphenylthiol (thiol is attached to the end of two bonded phenyl rings) interposed between gold agrees with a value by tunneling between gold electrodes. However, a current-voltage characteristic of terphenylthiol (three phenyl rings are linearly arrayed and bonded and thiol is attached to the end thereof) does not agree with a value by tunneling between gold electrodes. This means that there is a conduction path along which a charge injected from the electrode includes the trap in the molecule.

Hence a charge can transport by tunneling in the nearest neighbor phenyl ring of electrodes, but a charge is trapped by the center phenyl ring. Accordingly, the cut-off distance is corresponding to a length of one phenyl ring linked to the electrode.

The carrier injected from the electrode is considered to be transported along a z-axis, a change in potential along the z-axis is to be calculated. Two cut-offs (distances) along the z-axis are considered, and a z-coordinate closer to an electrode 1 is taken as $-z_{c0}$ while a z-coordinate closer to electrode 2 is taken as $z_{c1}$. At this time, activation energy $\Delta_1$ and $\Delta_2$ are calculated as:

$$\Delta_1 = \max_{-z_0 < z < -z_{c0}} (U(z))$$

$$\Delta_2 = \max_{z_{c1} < z < z_1} (U(z))$$

When this activation energy is used, a threshold voltage $V_{th}^+$ on the positive side where a current rises and a threshold voltage $V_{th}^-$ on the negative side are given by:

$$V_{th}^+ = \frac{I_P + \Delta_2 - E_{F1}}{\eta}$$

$$V_{th}^- = -\frac{I_P + \Delta_1 - E_{F1}}{\eta},$$

where V is the bias between the electrode 1 (reference) and the electrode 2, $I_P$ is the ionized potential (vacuum level seen from a HOMO level) of the molecule, and $E_{F1}$ is the work function of the electrode 1.

Here, η is a ratio of a potential difference between the electrode 1 and the molecule with respect to a bias applied to between the electrodes, and when a wave function (generally HOMO) distributed to conduction of the molecule is φ(x, y, z), by using a length l, which can be given by following:

$$\int_{-\infty}^{\infty} dx \int_{-\infty}^{\infty} dy \int_{-z_0}^{l} dz \phi^*(x, y, z) \phi(x, y, z) = \frac{1}{2}.$$

The η is given by:

$$\eta = \frac{l}{z_0 + z_1}$$

Here, φ*(x, y, z) represents a complex conjugate function of φ(x, y, z). Generally, it is estimated as η=0.5 with the symmetric molecule in the z direction.

When the electrode 1 and the electrode 2 are both bonded by the linker moieties, by further using a work function $E_{F2}$ of the electrode 2, the threshold functions are given by:

$$V_{th}^+ = \frac{I_P + \Delta_2 - E_{F2}}{\eta}$$

$$V_{th}^- = -\frac{I_P + \Delta_1 - E_{F1}}{1 - \eta}$$

Judging from this equation, the difference of activation energy may cancel out an effect by the difference of the work function which occurs by using the different metal as an electrode. Hence the electrodes need to be selected such that the rectification is shown. How to select the electrodes depends on the direction of the dipole moment in the molecule.

Using these threshold voltages, a rectification parameter ξ seen from the current-voltage characteristic can be defined:

$$\xi = \frac{-V_{th}^-}{V_{th}^+ - V_{th}^-}$$

In this definition, ξ is a dimensionless number in the range of 0<ξ<1.

"ξ=0.5" means that there is no rectification, namely a current rises at positive/negative voltages with biases having the same absolute value. Further, the region of ξ>0.5 shows a large current in the positive bias; the positive bias corresponds to a forward direction in a normal semiconductor diode. The other region of ξ<0.5 shows a large current in negative bias; the positive bias corresponds to a reverse direction in a normal semiconductor diode. Generally, the device with ξ in 0.6>ξ>0.4 shows a large leak current resulting from the small activation energy, which is corresponds to the difference between absolute value of $V_{th}^+$ and absolute value of $V_{th}^-$. This large leak current is not preferable in application to the circuit.

In the first embodiment, the organic molecule 16 is provided with the linker moiety 20 for bonding the π-conjugated molecular chain 18 with the first conductive layer 10. Then, the acceptor part is provided in the π-conjugated molecular chain 18 on the opposite side to the linker moiety 20, to generate a dipole which is headed in a direction from the acceptor part to the π-conjugated molecular chain 18. As a result, $\Delta_1$ is made large as compared with $\Delta_2$, and the rectification device of which the forward direction is to apply the positive bias to the first conductive layer 10 by using the second conductive layer 12 as the voltage reference can be obtained; the forward direction is that an absolute value of the threshold voltage $V_{th}^+$ on the positive side where a current rises is smaller than an absolute value of the threshold voltage $V_{th}^-$ on the negative side.

In the case of selecting different metals for the two electrodes, when $\eta=0.50$, $E_{F1}-E_{F2}<\Delta_1-\Delta_2$ is required in order not to cancel the rectification. Since $\Delta_1-\Delta_2>0$, $E_{F1}$ and $E_{F2}$ may only be $E_{F1}<E_{F2}$. That is, in the first embodiment, it is preferable to use, for the first conductive layer 10, a material having a larger work function than that of the second conductive layer 12.

(Design of Molecule Having Rectification)

Obviously from the above, it is dipole of the molecules that controls rectification characteristics of a device. Further, one contributed to activation energy is a component of the dipole in a conduction direction (z-axis) of the molecule.

For making such a dipole, it is effective to withdraw π-electrons having uniformly spread in a one-dimensional or quasi one-dimensional π-conjugated system chain, by the donor part or the acceptor part attached to one side. The molecule with a large dipole can be obtained by attaching the donor part in one side of the π-conjugated system chain and the acceptor part in another side of the π-conjugated system chain. However, this structure is easy to ionize and thus susceptible to moisture and the like. In addition to this, the conduction carrier prevents the dipole from transporting, because Coulomb repulsion force, which is caused by the coexistence of a positive and a negative ionized part, strongly acts for a conduction carrier.

In order to prevent the donor part and the acceptor part from transporting the carrier, it is desirable that these parts also have the π-conjugation structure. For this purpose, it is possible to use a donor part and an acceptor part each obtained by introducing a substituent group to the π-conjugated system such as the phenyl ring. An influence of a dipole with this substituent group will be argued below.

(Other Effects Exerted by Dipole Bonded to π-Conjugated System)

Shown above is the effect of the static potentials created by the dipole. Other than this, there is an effect (electron-lattice interaction. This equals to electron-phonon interaction or electron-phonon coupling.) on a charge exerted by the dipole through a phonon. An atom in the molecule is displaced from a balanced position due to collective excitation, namely phonon, by heat. In the case of the π-conjugated system, a large dipole can be introduced to an atom group (substituent group) bonded not in a direction of a conjugated main chain but in a direction of side chain branching from the main chain.

Figure 9:
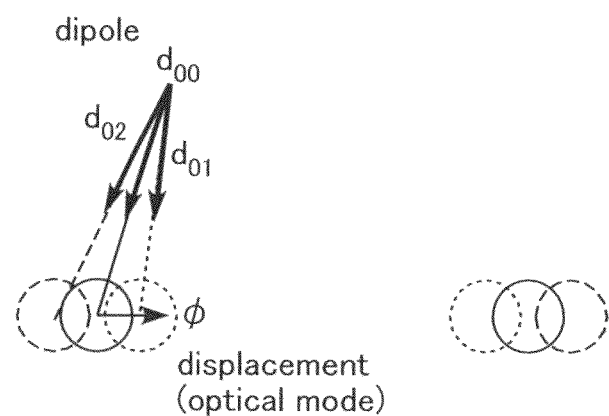
FIG. 9 is a diagram showing an influence of a bond moment on an electron-lattice interaction.

FIG. 9 is a diagram showing an influence of a bond moment on an electron-lattice interaction. As shown in FIG. 9, a dipole of the side chain cannot follow the optical phonon of the main chain, namely it cannot be displaced in the same direction, and hence displacement in the direction of the dipole moment occurs associated with atomic displacement of the main chain.

A change in dipole due to this directional displacement is described as a change in polarization due to the phonon. This polarization is connected with the charge by Coulomb force, and when the polarization is large, it is attracted to a periphery of the charge, to form a state where the charge and the polarization move together. This state is called polaron.

Hence, when a change occurs in an effect of the polarization due to the position of the dipole, conduction characteristics of the molecule changes. Therefore, how the polarization due to the phonon changes due to the change in position of the dipole will be described below.

In FIG. 9, an X-direction is a lateral direction, a plane on which π-conjugation is performed is made to agree with a paper surface, and a Y-direction is a longitudinal direction. It is assumed that an atom at a position (0, 0) is displaced due to the phonon just by ϕ in the X-direction. Thereby, the dipole present at a position (a, b) of the side chain changes from a vector $d_{00}$:

$$d_{00} = \frac{|d|}{\sqrt{a^2+b^2}}(a, b)$$

to $d_{01}$:

$$d_{01} = \frac{|d|}{\sqrt{(a+\phi)^2+b^2}}(a+\phi, b)$$

When it is assumed that the displacement ϕ due to the phonon is sufficiently small as compared with a, b, it can be approximated as:

$$\frac{1}{\sqrt{(a+\phi)^2+b^2}} = \frac{1}{\sqrt{a^2+b^2}}\sqrt{\frac{a^2+b^2+2a\phi+\phi^2}{a^2+b^2}} \simeq$$

$$\frac{1}{\sqrt{a^2+b^2}}\frac{1}{\sqrt{1+\frac{2a\phi}{a^2+b^2}}} \simeq \frac{1}{\sqrt{a^2+b^2}}\left(1-\frac{a\phi}{a^2+b^2}\right)$$

Therefore, polarization (dipole) P induced (in the direction of the main chain) can be evaluated as:

$$P = d_{01} - d_{00}$$

$$= \frac{|d|}{\sqrt{a^2+b^2}}\left(a-\frac{a^2\phi}{a^2+b^2}, b-\frac{ab\phi}{a^2+b^2}\right) - \frac{|d|}{\sqrt{a^2+b^2}}(a, b)$$

$$= -\frac{|d|}{\sqrt{a^2+b^2}}\left(\frac{a^2}{a^2+b^2}, \frac{ab}{a^2+b^2}\right)\phi$$

That is, introducing the dipole to the side chain allows an increase in electron-lattice interaction. Therefore, the dipole as thus introduced is likely to change the conduction characteristics of the original skeleton.

In an actual molecular structure, a plurality of dipoles are often introduced by a plurality of substituent groups. Here, an evaluation will be made as to what polarization occurs in a dipole introduced to an adjacent atom due to an optical phonon.

Figure 10A:
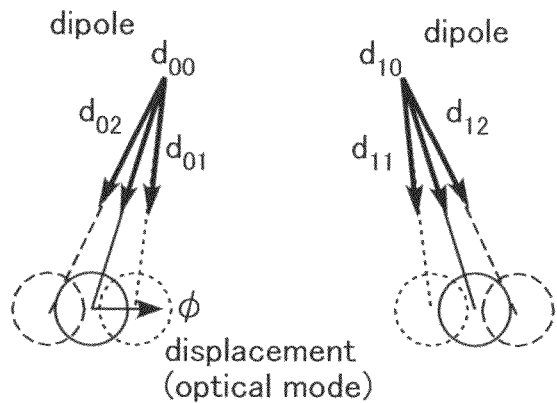
FIGS. 10A and 10B are diagrams each showing an influence of a bond moment on an electron-lattice interaction in the case of a plurality of substituent groups being present.
Figure 10B:
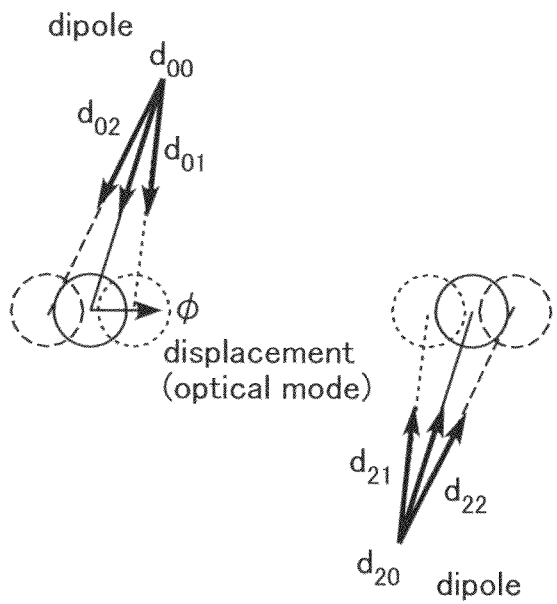

FIGS. 10A and 10B are diagrams each showing an influence of a bond moment on an electron-lattice interaction in the case of a plurality of substituent groups being present. In the π-conjugated system, the optical phonon is displaced in the opposite direction between adjacent atoms, and hence the dipole present on the side chain of the adjacent atom is displaced in the reverse direction to the direction of the main chain (X-direction).

FIGS. 10A and 10B show this state. In the case of introducing the side chain having the dipole in the adjacent atom, there are assumed two sorts of introduction: line-symmetrical introduction as in FIG. 10A; and a point-symmetrical introduction as in FIG. 10B.

In the case of the line-symmetry, when polarization due to the phonon of the dipole (a, b) is $P_1$, it is given by:

$$P_1 = -\frac{|d|}{\sqrt{a^2+b^2}}\left(\frac{a^2}{a^2+b^2}, \frac{ab}{a^2+b^2}\right)\phi$$

Polarization of the other dipole (−a, b) is $P_2$, and it is given from the symmetry (displacement is −φ) of the phonon by:

$$P_2 = \frac{|d|}{\sqrt{a^2+b^2}}\left(\frac{a^2}{a^2+b^2}, -\frac{ab}{a^2+b^2}\right)\phi$$

Hence total polarization P is given as:

$$P = P_1 + P_2 = \frac{|d|}{\sqrt{a^2+b^2}}\left(0, \frac{2ab}{a^2+b^2}\right)\phi$$

As apparent from this formula, it is found that in the case of the line-symmetrical arrangement, each polarization in the direction of the main chain cancels each other, and only small polarization in the longitudinal direction is left. Therefore, the dipole as thus introduced tends not to change the conduction characteristics of the original skeleton.

Subsequently, in the case of the point-symmetry, when polarization due to the phonon of the dipole (a, b) is $P_1$, it is given by:

$$P_1 = -\frac{|d|}{\sqrt{a^2+b^2}}\left(\frac{a^2}{a^2+b^2}, \frac{ab}{a^2+b^2}\right)\phi$$

Polarization of the other dipole (−a, −b) is $P_2$, and it is given from the symmetry (displacement is −φ) of the phonon by:

$$P_2 = \frac{|d|}{\sqrt{a^2+b^2}}\left(\frac{a^2}{a^2+b^2}, \frac{ab}{a^2+b^2}\right)\phi$$

Hence total polarization P is given as:

$$P = P_1 + P_2 = 0$$

It is thus found that each polarization completely cancels each other. That is, each contribution of the dipole introduced by point-symmetry cancels each other, thereby not contributing the electron-lattice interaction. Therefore, the dipole as thus introduced tends not to change the conduction characteristics of the original skeleton.

Figure 11A:
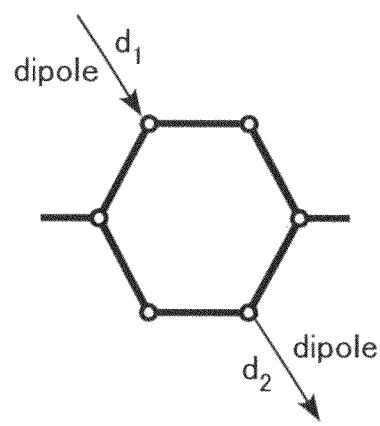
FIGS. 11A and 11B are diagrams each explaining a ring-shaped structure and directions of dipoles by substituent groups.
Figure 11B:
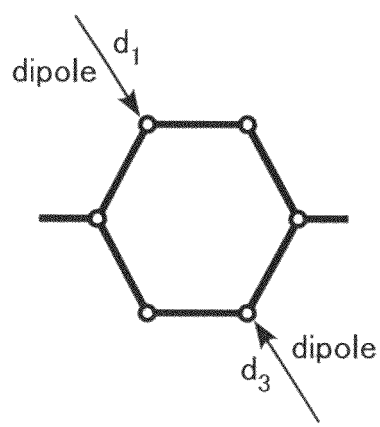

FIGS. 11A and 11B are diagrams each explaining a ring-shaped structure and directions of dipoles by substituent groups. In the π-conjugated system having electric conduction, it is the ring-shaped structure that is important as is the linear structure as described above.

Hereinafter, the ring-shaped structure (phenyl ring structure) as in FIGS. 11A and 11B will be considered and polarization by a phonon of a dipole bonded to this structure will be considered. In this case, because the dipole bonded to an adjacent atom is the same as in the case of the straight chain, there may only be considered dipoles at positions (para position) opposed to each other in the ring, which is peculiar to the ring structure. In this case, there exist a case where directions of the dipoles are parallel as in FIG. 11A and a case where those are antiparallel as in FIG. 11B.

Figure 12A:
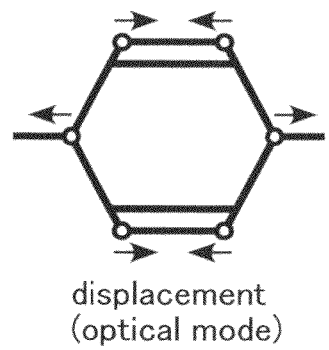
FIGS. 12A and 12B are diagrams each explaining a ring-shaped structure and a mode of an optical phonon.
Figure 12B:
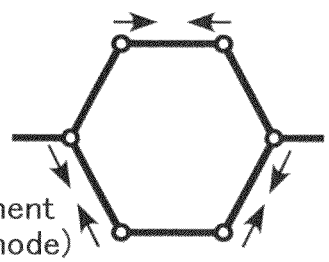

FIGS. 12A and 12B are diagrams each explaining a ring-shaped structure and a mode of an optical phonon. In the ring-shaped structure, there exist two kinds of mode of the optical phonon, which are a mode (quinone mode) headed outside the ring shown in FIG. 12A and a mode (phenyl mode) in the ring shown in FIG. 12B. It is known that in the ring-shaped π-conjugated system connected in the para position, a π electron is localized in each ring in a neutral state, whereas a π electron is non-localized across a boundary in a charge state (polaron) and its structure thus becomes like quinone.

In the case of the quinone mode, vibration directions of root atoms of two dipoles are opposite directions to each other (vibration vectors are (φ, 0) and (−φ, 0)). On the other hand, in the case of the phenyl mode, vibration directions of root atoms of two dipoles are not opposite directions to each other. In the case of the phenyl mode, when the upper-side atom of FIG. 12B vibrates in the direction of (φ, 0), the lower-side atom vibrates in a direction of (φ/2, $3^{1/2}$φ/2), and when the upper-side atom vibrates in a direction of (−φ/2, −$3^{1/2}$φ/2), the lower-side atom vibrates in a direction of (−φ, 0).

It is thus found that, although the vibration directions are complicated on the phenyl mode, they can be made to be one direction by inverting a sign of φ and replacing the atom, and hence calculation in one case may be performed as has conventionally be done. In the following, combination of these four (=two kinds of dipoles×two kinds of phonons) is calculated.

There will be considered the case of parallel dipoles and a quinone-mode phonon. In this case, when polarization due to the phonon of the dipole (a, b) is $P_1$, it is given by:

$$P_1 = -\frac{|d|}{\sqrt{a^2+b^2}}\left(\frac{a^2}{a^2+b^2}, \frac{ab}{a^2+b^2}\right)\phi$$

Polarization $P_2$ of the other dipole (−a, b) is given from the symmetry (displacement is −φ) of the phonon by:

$$P_2 = \frac{|d|}{\sqrt{a^2+b^2}}\left(\frac{a^2}{a^2+b^2}, \frac{ab}{a^2+b^2}\right)\phi$$

Hence total polarization P is given as:

$$P = P_1 + P_2 = 0$$

It is thus found that each polarization completely cancels each other.

That is, each contribution of the dipole introduced by point-symmetry cancels each other, thereby not contributing the electron-lattice interaction. Therefore, the dipole as thus introduced tends not to change the conduction characteristics of the original skeleton.

Next, there will be considered the case of parallel dipoles and a phenyl-mode phonon. In this case, when polarization due to the phonon of the dipole (a, b) is $P_1$, it is given by:

$$P_1 = -\frac{|d|}{\sqrt{a^2+b^2}}\left(\frac{a^2}{a^2+b^2}, \frac{ab}{a^2+b^2}\right)\phi$$

Polarization $P_2$ of the other dipole (–a, b) is given from the symmetry (displacement is $(\phi/2, 3^{1/2}\phi/2)$ of the phonon by:

$$P_2 = -\frac{|d|}{2\sqrt{a^2+b^2}}\left(\frac{a^2+\sqrt{3}\,ab}{a^2+b^2}, \frac{ab+\sqrt{3}\,b^2}{a^2+b^2}\right)\phi$$

Hence total polarization P is given as:

$$P = P_1 + P_2 = -\frac{|d|}{2\sqrt{a^2+b^2}}\left(\frac{3a^2+\sqrt{3}\,ab}{a^2+b^2}, \frac{ab+(\sqrt{3}+2)b^2}{a^2+b^2}\right)\phi$$

The dipole effect is a sum and thus increases.

That is, with this arrangement, the electron-lattice interaction due to the phenyl-mode phonon can be increased. Therefore, the dipole as thus introduced is likely to change the conduction characteristics of the original skeleton.

There will be considered the case of antiparallel dipoles and a quinone-mode phonon. In this case, when polarization due to the phonon of the dipole (a, b) is $P_1$, it is given by:

$$P_1 = -\frac{|d|}{\sqrt{a^2+b^2}}\left(\frac{a^2}{a^2+b^2}, \frac{ab}{a^2+b^2}\right)\phi$$

Polarization $P_2$ of the other dipole (–a, b) is given from the symmetry (displacement is $-\phi$) of the phonon by:

$$P_2 = -\frac{|d|}{\sqrt{a^2+b^2}}\left(\frac{a^2}{a^2+b^2}, \frac{ab}{a^2+b^2}\right)\phi$$

Hence total polarization P is given as:

$$P = P_1 + P_2 = -2\frac{|d|}{\sqrt{a^2+b^2}}\left(\frac{a^2}{a^2+b^2}, \frac{ab}{a^2+b^2}\right)\phi$$

The dipole effect is a sum and thus increases.

That is, with this arrangement, the electron-lattice interaction due to the quinone-mode phonon can be increased. Therefore, the dipole as thus introduced is likely to change the conduction characteristics of the original skeleton.

Finally, there will be considered the case of parallel dipoles and phenyl-mode phonon. In this case, when polarization due to the phonon of the dipole (a, b) is $P_1$, it is given by:

$$P_1 = -\frac{|d|}{\sqrt{a^2+b^2}}\left(\frac{a^2}{a^2+b^2}, \frac{ab}{a^2+b^2}\right)\phi$$

Polarization of the other dipole (–a, –b) is $P_2$, and it is given from the symmetry (displacement is $(\phi/2, 3^{1/2}\phi/2)$) of the phonon by:

$$P_2 = \frac{|d|}{2\sqrt{a^2+b^2}}\left(\frac{a^2+\sqrt{3}\,ab}{a^2+b^2}, \frac{ab+\sqrt{3}\,b^2}{a^2+b^2}\right)\phi$$

Hence total polarization P is given as:

$$P = P_1 + P_2 = -\frac{|d|}{2\sqrt{a^2+b^2}}\left(\frac{-a^2+\sqrt{3}\,ab}{a^2+b^2}, \frac{-ab+\sqrt{3}\,b^2}{a^2+b^2}\right)\phi$$

As apparent from this formula, it is found that each polarization cancels each other and only small polarization is left. That is, the contribution to the electron-lattice interaction is small. Therefore, the dipole as thus introduced tends not to change the conduction characteristics of the original skeleton.

Table below shows a summary of the relation between the foregoing position/direction of the dipole moment and the electron-lattice interaction:

| structure | | kind of phonons | | |
|---|---|---|---|---|
| dipole position | dipole direction | optical mode | inside ring | between rings |
| adjacent atom | same direction (line-symmetry) | | weak | |
| | opposite direction (point-symmetry) | | | canceled |
| cyclic para-position | parallel | weak | strong | canceled |
| | antiparallel | canceled | weak | strong |

For conduction control of the one-dimensional π-conjugated system module, the dipole by the bond moment may be introduced. Taking the mode of the phonon into consideration, in the case of introducing a plurality of dipoles, when the dipoles are placed at adjacent positions, they can be introduced without causing a change in conduction characteristics. When the dipoles are introduced in the para position by using the phenyl rings, the conduction characteristics are likely to be changed as compared with the original structure.

In order to make the phenyl ring serve as the acceptor part without having an influence on the conduction, for example, the structure such as those in FIGS. 5A to 5E may be formed as described above. However, the structure of FIG. 5E might accompany a change in characteristics. In the case of making the phenyl ring serve as the donor part, the electron releasing group may be bonded in place of the electron withdrawing group as described later.

The activation energy $\Delta_1$ and $\Delta_2$ being the cause of the rectification are changes in potentials along the main chain (conduction direction: z-axis) of the molecule, and hence contribution of the dipole in the direction of the main chain is dominant. The acceptor part where an electron density of the whole phenyl ring has been modulated as in each of FIGS. 5A to 5E is effective since the electron density of the π-conjugated system is modulated.

However, the donor or acceptor substituent group attached to the side chain of the phenyl ring at the center has a small component of the dipole in the direction of the main chain. Further, the dipole does not exist on the conduction path and is distant from the carrier, and hence the contribution to the potential is small. Hence there is a large difference in effect between the dipole introduced to the side chain and the unbalance of the π electron in the main chain by introduction of the electron releasing part (donor part) D or the electron withdrawing part (acceptor) A to the main chain. The effect of the embodiment is brought by the unbalance of the π electron in the main chain caused by introduction of the acceptor part or the donor part to the main chain.

As for the one-dimensional π-conjugated system molecule, when the π-conjugated system chain is short, an electron injected from the electrode passes therethrough without remaining on the molecule, and the effect of the dipole of the molecule is thus not reflected. For this reason, a one-dimensional π-conjugated system chain formed by alternate bonding by not less than 12 single and double bonds is desired.

Figure 13:
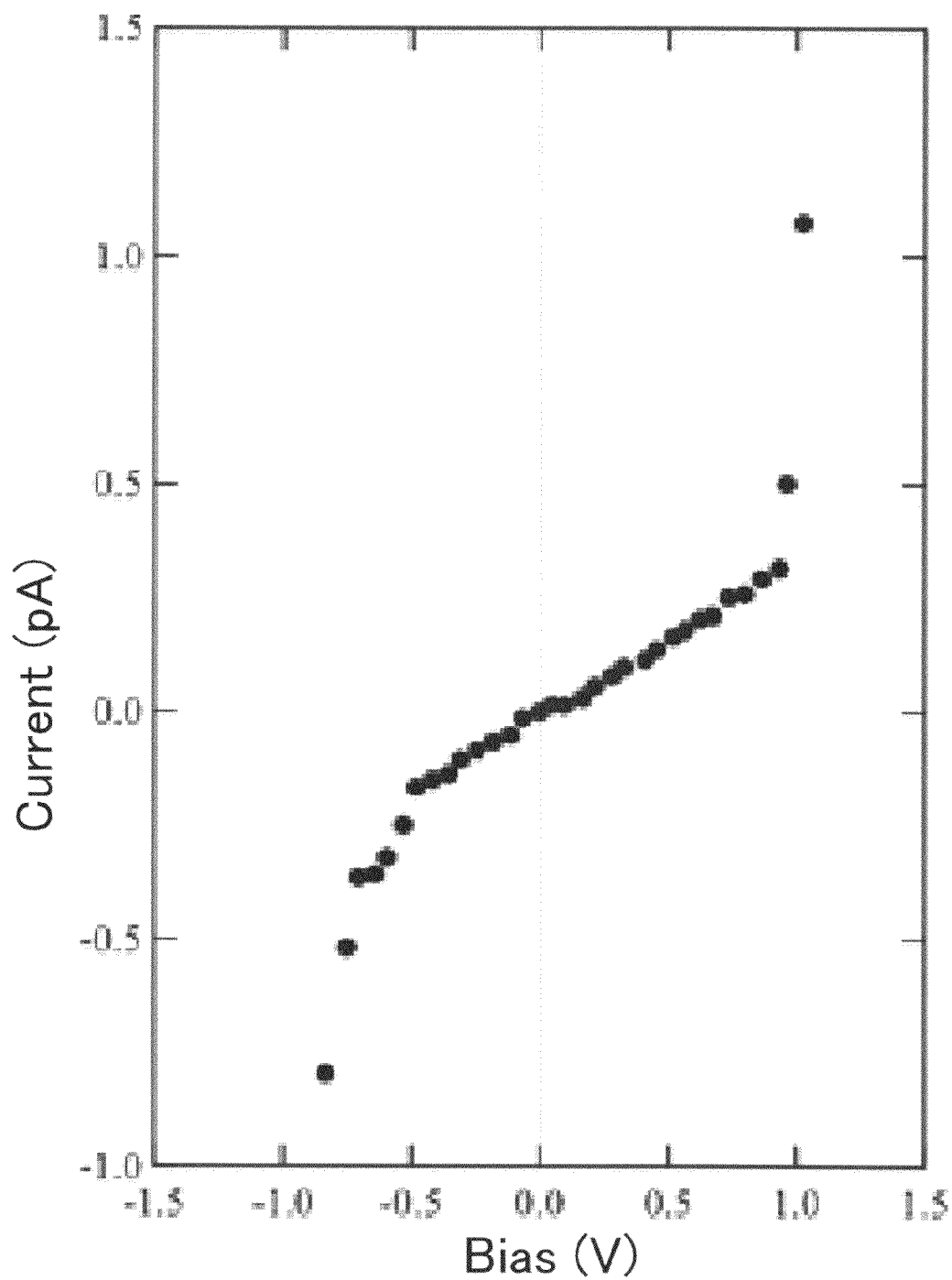
FIG. 13 is a diagram showing a current-voltage characteristic of a molecule (diphenylthiol) where two phenyl rings having a thiol group at the end are bonded in a para position.
Figure 14:
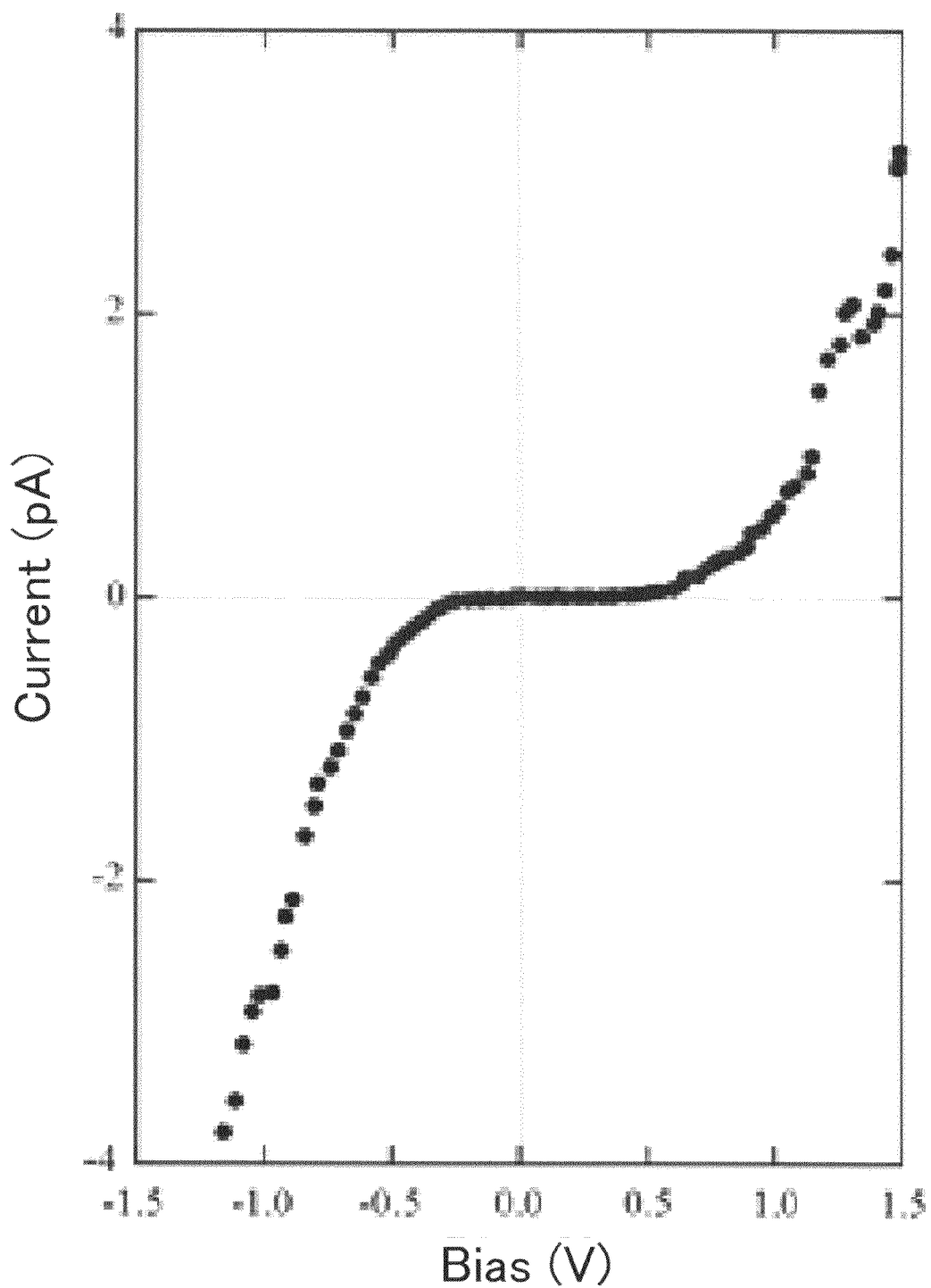
FIG. 14 is a diagram showing a current-voltage characteristic of a molecule (terphenylthiol) where three phenyl rings having the thiol group at the end are bonded in the para position.

FIG. 13 is a diagram showing a current-voltage characteristic of a molecule (diphenylthiol) where two phenyl rings having a thiol group at the end are bonded in the para position. Further, FIG. 14 is a diagram showing a current-voltage characteristic of a molecule (terphenylthiol) where three phenyl rings having the thiol group at the end are bonded in the para position.

It is seen from these figures that in the case of diphenyl, a current flows even in a low voltage region of not higher than 0.5 V, and in the case of three phenyl rings, a current is not observed. This means that in the case of two phenyl rings, an electron passes from the electrode to the electrode by tunneling as described above. This also means that in the case of three phenyl rings, since a charge remains on the molecule, a current does not flow when energy alignment between a discrete level of the molecule and a level of the electrode cannot be achieved.

In the rectification device, a current in the vicinity of 0 V (low voltage region) is merely a leak current, and only brings the effect of damaging the characteristics. For this reason, it is preferable to provide, as the one-dimensional π-conjugated system molecule, a one-dimensional π-conjugated system chain, whose length leads to little occurrence of a leak current and which is formed by alternate bonding by not less than 12 single and double bonds.

Further, when the π-conjugated system is long, a voltage drop or the like due to charge conduction in the molecule is problematic. For this reason, a one-dimensional π-conjugated system chain (not more than ten benzene rings) formed by alternate bonding by not more than 40 single and double bonds are desired. It is known that in the charge state (carrier=polaron), π electrons are non-localized across a boundary between the benzene rings, and become stable when spreading to five benzene rings. Therefore, when they extend to have a length of not less than ten benzene rings, a plurality of carriers (polarons) can stably exit in one molecular chain.

With the π-conjugated system being one-dimensional, each carrier cannot overtake each other. For this reason, movement of the carriers is adjusted to movement of the slowest carrier among the one-dimensionally arrayed carriers. Further, a repulsive potential by Coulomb force between the carriers becomes activation energy of the movement. This results in that an average moving velocity of the carriers becomes low, namely a current becomes small, in the case of the molecular length where a plurality of carriers are put as compared with the case of the molecular length where only one carrier can be put. Hence the molecular length where two polarons can be put, namely the molecule of ten or less benzene rings, is desired.

A structure to be used is a paraphenylene derivative, an oligothiophene derivative, an olygopyrol derivative, an oligofuran derivative, a polyparaphenylene vinylene derivative, a phenyl ethynylene derivative or the like.

The charge flowing in the molecule is a charge injected from the electrode by tunneling. Further, in the embodiment, since energy alignment between the fermi level of the electrode and the level of the molecule is used, the charge injection cannot occur when a vacuum level such as a Fowler-Nordheim mechanism is used in tunneling from the electrode. Therefore, when direct tunneling from the electrode to the molecule is possible, the charge injection occurs even if an insulating layer of an oxide, a nitride or the like exists on the surface of the electrode. However, the insulating layer is desirably thin to such an extent that the charge can tunnel from metal to the molecule, and the film thickness of the insulating layer is desirably not larger than 3 nm.

As described above, the organic molecular device of the present embodiment can realize stable rectification characteristics while having a small size.

Second Embodiment

An organic molecular device of the present embodiment is provided with a first conductive layer, a second conductive layer and an organic molecular layer. The organic molecular layer is provided between the first conductive layer and the second conductive layer. The organic molecular layer has an organic molecule. The organic molecule includes a one-dimensional or quasi one-dimensional π-conjugated system chain. The π-conjugated system chain has a second aromatic ring. The second aromatic ring has one or more substituents that are an electron releasing group, and each substituent of the second aromatic ring is independently selected from the group consisting of the electron releasing group and hydrogen. The second aromatic ring exist in an unbalanced manner in the π-conjugated system chain.

The organic molecular device of the present embodiment is similar to that of the first embodiment except that the organic molecule is provided with the second aromatic ring in place of the first aromatic ring. Hence descriptions of contents that overlap those of the first embodiment will be omitted.

Figure 15:
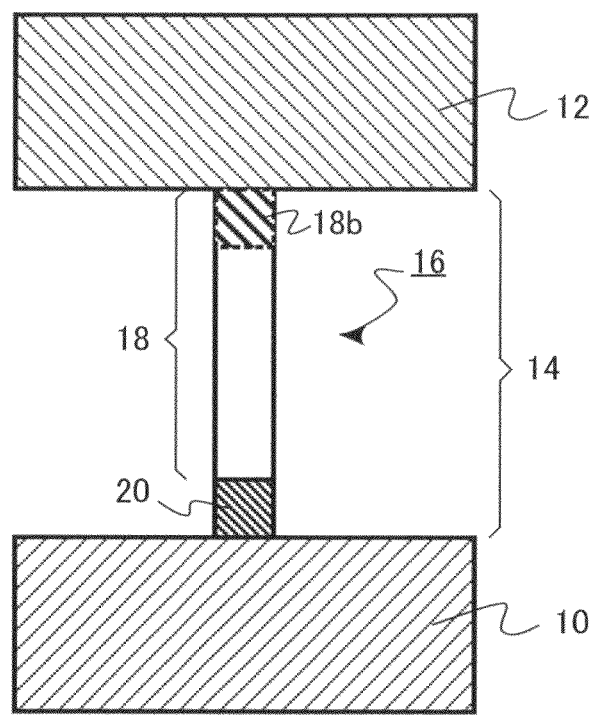
FIG. 15 is a schematic sectional view showing a structure in an organic molecular layer of a second embodiment.

FIG. 15 is a schematic sectional view showing a structure in the organic molecular layer of the present embodiment.

The organic molecular layer 14 is made up of a plurality of organic molecules 16. FIG. 15 shows only one organic molecule 16 for convenience' sake.

The organic molecule 16 includes a one-dimensional or quasi one-dimensional π-conjugated system chain 18. The π-conjugated system chain 18 only has an aromatic ring 18b bonded only with an electron releasing group out of: an aromatic ring (first aromatic ring) bonded only with an electron withdrawing group out of an electron withdrawing group and an electron releasing group; and an aromatic ring (second aromatic ring) bonded only with an electron releasing group out of an electron withdrawing group and an electron releasing group. This aromatic ring 18b exists in an unbalanced manner in the π-conjugated system chain 18.

FIGS. 16A to 16E are diagrams each exemplifying a molecular structure of the aromatic ring 18b bonded only with the electron releasing group, namely the electron releasing part (donor part) D. In the figure, $X_D$ is, for example, an amino group.

Figure 16A:
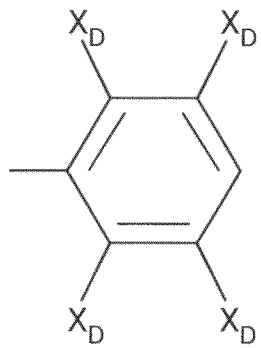
FIGS. 16A to 16E are diagrams each exemplifying a molecular structure of an aromatic ring bonded only with an electron releasing group in the second embodiment.
Figure 16D:
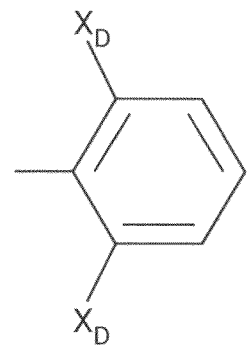
Figure 16B:
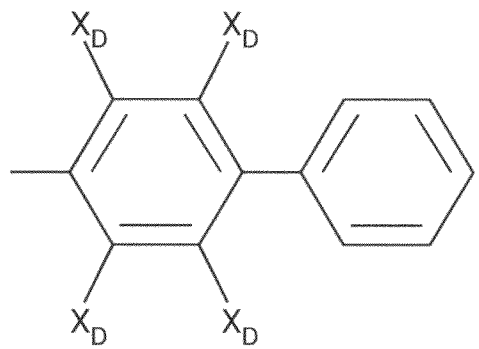
Figure 16E:
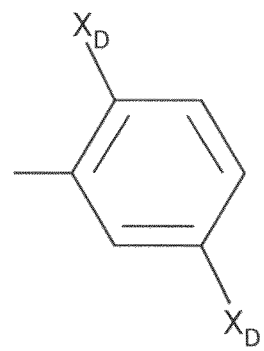
Figure 16C:
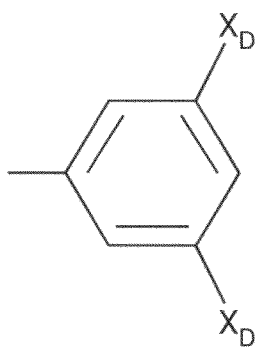

In addition, from the viewpoint of forming an effective dipole in the organic molecule 16, the electron releasing group bonded to the aromatic ring 18b is desirably arranged symmetrically about a line through a bonding direction of the π-conjugated system chain 18. The bonding direction of the π-conjugated system chain 18 is the extending direction of the main chain of the π-conjugated system chain 18. For example, a direction of a σ bond connected to the aromatic ring 18b is the bonding direction of the π-conjugated system chain 18. From this viewpoint, among the aromatic rings 18b in FIGS. 16A to 16E, those except for the one in FIG. 16E are desired.

In the present embodiment, from the viewpoint of improving the rectification characteristic of the diode, a work function of the second conductive layer 12 is desirably larger than a work function of the first conductive layer 10.

In the present embodiment, the organic molecule 16 is provided with the linker moiety 20 for bonding the π-conjugated molecular chain 18 with the first conductive layer 10. Further, the donor part is provided in the π-conjugated molecular chain 18 on the opposite side to the linker moiety 20, to generate a dipole which is headed in a direction from the donor part 18b to the π-conjugated molecular chain 18. This leads to realization of the rectification that, when $\Delta_1$ is made large as compared with $\Delta_2$ and a negative potential is applied to the second conductive layer 12 with the first conductive layer 10 taken as a reference, the bias is a forward bias (an absolute value of the threshold voltage $V_{th}^+$ on the positive side where a current rises is larger than an absolute value of the threshold voltage $V_{th}^-$ on the negative side).

In the case of selecting different metals for the two electrodes, when $\eta=0.50$, $E_{F1}-E_{F2}<\Delta_2-\Delta_1$ is required in order not to cancel the rectification. Since $\Delta_2-\Delta_1>0$, $E_{F1}$ and $E_{F2}$ may only be $E_{F2}<E_{F1}$. That is, it is preferable to use, for the second conductive layer 12, a material having a larger work function than that of the first conductive layer 10.

The organic molecular device of the present embodiment can realize stable rectification characteristics while having a small size.

Third Embodiment

The organic molecular device of the present embodiment is similar to that of the first embodiment except that the first aromatic ring 18a is present on the linker moiety 20 side of the π-conjugated system chain 18. Hence descriptions of contents that overlap those of the first embodiment will be omitted.

Figure 17:
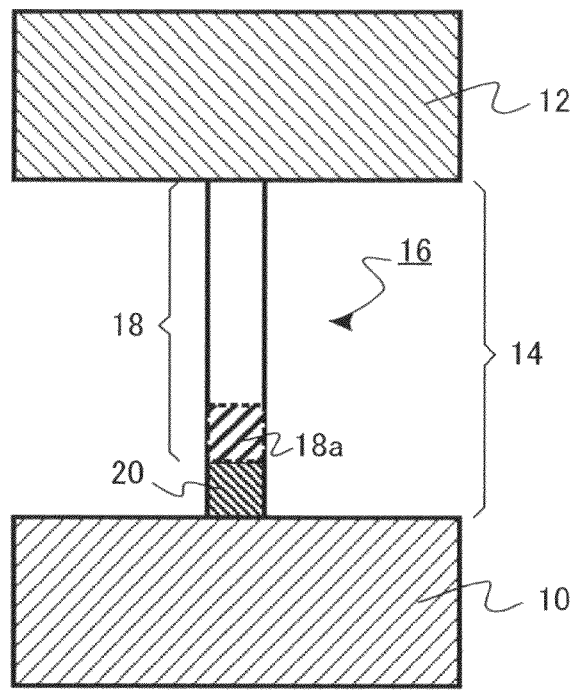
FIG. 17 is a schematic sectional view showing a structure in an organic molecular layer of a third embodiment.

FIG. 17 is a schematic sectional view showing a structure in the organic molecular layer of the present embodiment.

In the present embodiment, from the viewpoint of improving the rectification characteristic of the diode, a work function of the second conductive layer 12 is desirably larger than a work function of the first conductive layer 10.

In the present embodiment, the π-conjugated molecular chain 18 is provided with the acceptor part 18a on the first conductive layer 10 side. The organic molecule 16 is provided with the linker moiety 20 for bonding the acceptor part 18a with the first conductive layer 10. With this configuration, the dipole headed in a direction from the acceptor part 18a to the π-conjugated molecular chain 18 is generated. This leads to realization of the rectification that, when $\Delta_2$ is made large as compared with $\Delta_1$ and a negative potential is applied to the second conductive layer 12 with the first conductive layer 10 taken as a reference, the bias is a forward bias (an absolute value of the threshold voltage $V_{th}^+$ on the positive side where a current rises is larger than an absolute value of the threshold voltage $V_{th}^-$ on the negative side).

In the case of selecting different metals for the two electrodes, when $\eta=0.50$, $E_{F2}-E_{F1}<\Delta_2-\Delta_1$ is required in order not to cancel the rectification. Since $\Delta_2-\Delta_1>0$, $E_{F1}$ and $E_{F2}$ may only be $E_{F2}<E_{F1}$. That is, it is preferable to use, for the second conductive layer 12, a material having a larger work function than that of the first conductive layer 10.

The organic molecular device of the present embodiment can realize stable rectification characteristics while having a small size.

Fourth Embodiment

The organic molecular device of the present embodiment is similar to that of the second embodiment except that the second aromatic ring 18b is present on the linker moiety 20 side of the π-conjugated system chain 18. Hence descriptions of contents that overlap those of the second embodiment will be omitted.

Figure 18:
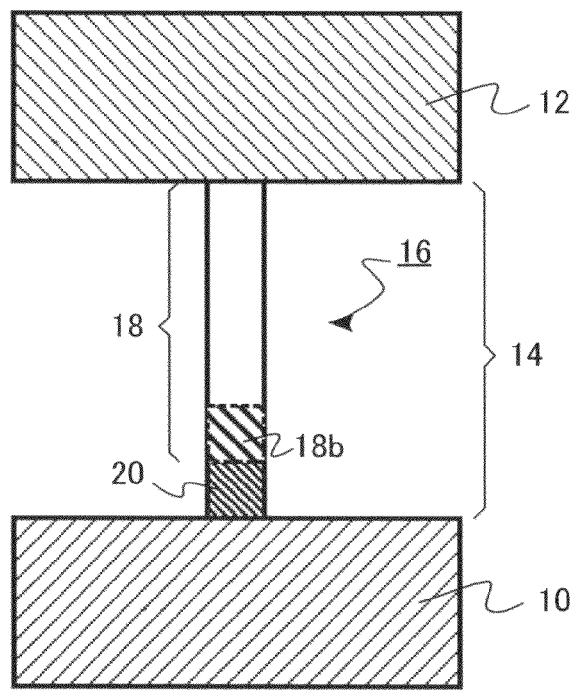
FIG. 18 is a schematic sectional view showing a structure in an organic molecular layer of a fourth embodiment.

FIG. 18 is a schematic sectional view showing a structure in the organic molecular layer of the present embodiment.

In the present embodiment, from the viewpoint of improving the rectification characteristic of the diode, a work function of the first conductive layer 10 is desirably larger than a work function of the second conductive layer 12.

In the present embodiment, the π-conjugated molecular chain 18 is provided with the donor part 18b on the first conductive layer side. The organic molecule 16 is provided with the linker moiety 20 for bonding the donor part 18b with the first conductive layer 10. With this configuration, the dipole headed in a direction from the donor part to the π-conjugated molecular chain 18 is generated. This leads to realization of the rectification that, when $\Delta_1$ is made large as compared with $\Delta_2$ and a positive potential is applied to the second conductive layer 12 with the first conductive layer 10 taken as a reference, the bias is a forward bias (an absolute value of the threshold voltage $V_{th}^+$ on the positive side where a current rises is smaller than an absolute value of the threshold voltage $V_{th}^-$ on the negative side).

In the case of selecting different metals for the two electrodes, when $\eta=0.50$, $E_{F1}-E_{F2}<\Delta_1-\Delta_2$ is required in order not to cancel the rectification. Since $\Delta_1-\Delta_2>0$, $E_{F1}$ and $E_{F2}$ may only be $E_{F1}<E_{F2}$. That is, it is preferable to use, for the first conductive layer 10, a material having a larger work function than that of the second conductive layer 12.

The organic molecular device of the present embodiment can realize stable rectification characteristics while having a small size.

Fifth Embodiment

The organic molecular device of the present embodiment is similar to that of the first embodiment except for being provided with two linker moieties of a first linker moiety 20a for bonding the π-conjugated system chain 18 with the first conductive layer 10 and a second linker moiety 20b for bonding the π-conjugated system chain 18 with the second conductive layer 12. Hence descriptions of contents that overlap those of the first embodiment will be omitted.

Figure 19:
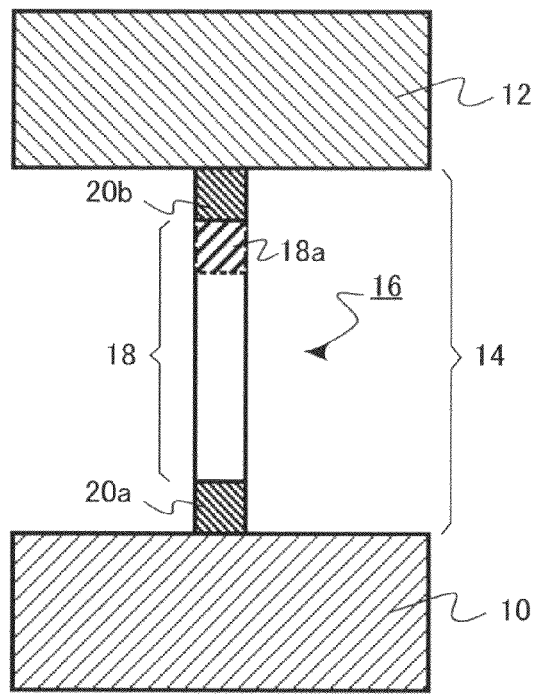
FIG. 19 is a schematic sectional view showing a structure in an organic molecular layer of a fifth embodiment.

FIG. 19 is a schematic sectional view showing a structure in the organic molecular layer of the present embodiment.

The organic molecule 16 is provided with the first linker moiety 20a for binding the π-conjugated system chain 18 to the first conductive layer 10. Further, it is provided with the second linker moiety 20b for binding the π-conjugated system chain 18 to the second conductive layer 12. The first aromatic ring 18a is provided on the second conductive layer 12 side of the π-conjugated system chain 18.

In the organic molecular device of the present embodiment, the organic molecule 16 is fixed to both the first conductive layer 10 and the second conductive layer 12. This thus leads to improvement in durability.

Further, in the present embodiment, from the viewpoint of improving the rectification characteristic of the diode, a work function of the first conductive layer 10 is desirably larger than a work function of the second conductive layer 12.

In the present embodiment, the dipole headed in a direction from the acceptor part 18a to the π-conjugated molecular chain 18 is generated. This leads to realization of the rectification that, when $\Delta_1$ is made large as compared with $\Delta_2$ and a positive potential is applied to the second conductive layer 12 with the first conductive layer 10 taken as a reference, the bias is a forward bias (an absolute value of the threshold voltage $V_{th}^+$ on the positive side where a current rises is smaller than an absolute value of the threshold voltage $V_{th}^-$ on the negative side).

In the case of selecting different metals for the two electrodes, when $\eta>_1=0.50$, $E_{F1}-E_{F2}<\Delta_1-\Delta_2$ is required in order not to cancel the rectification. Since $\Delta_1-\Delta_2>0$, $E_{F1}$ and $E_{F2}$ may only be $E_{F1}<E_{F2}$. That is, it is preferable to use, for the first conductive layer 10, a material having a larger work function than that of the second conductive layer 12.

The organic molecular device of the present embodiment can realize highly durable, stable rectification characteristics while having a small size.

Sixth Embodiment

The organic molecular device of the present embodiment is similar to that of the second embodiment except for being provided with two linker moieties of the first linker moiety 20a for bonding the π-conjugated system chain 18 with the first conductive layer 10 and the second linker moiety 20b for bonding the π-conjugated system chain 18 with the second conductive layer 12. Hence descriptions of contents that overlap those of the second embodiment will be omitted.

Figure 20:
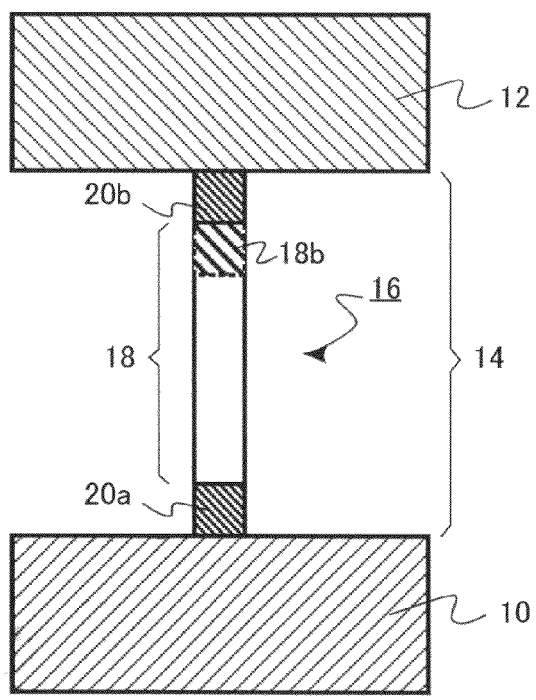
FIG. 20 is a schematic sectional view showing a structure in an organic molecular layer of a sixth embodiment.

FIG. 20 is a schematic sectional view showing a structure in the organic molecular layer of the present embodiment.

The organic molecule 16 is provided with the first linker moiety 20a for bonding the π-conjugated system chain 18 to the first conductive layer 10. Further, it is provided with the second linker moiety 20b for bonding the π-conjugated system chain 18 to the second conductive layer 12. The second aromatic ring 18b is provided on the second conductive layer 12 side of the π-conjugated system chain 18.

In the organic molecular device of the present embodiment, the organic molecule 16 is fixed to both the first conductive layer 10 and the second conductive layer 12. This thus leads to improvement in durability.

Further, in the present embodiment, from the viewpoint of improving the rectification characteristic of the diode, a work function of the second conductive layer 12 is desirably larger than a work function of the first conductive layer 10.

In the present embodiment, the dipole headed in a direction from the donor part 18b to the π-conjugated molecular chain 18 is generated. This leads to realization of the rectification that, when $\Delta_2$ is made large as compared with $\Delta_1$ and a negative potential is applied to the second conductive layer 12 with the first conductive layer 10 taken as a reference, the bias is a forward bias (an absolute value of the threshold voltage $V_{th}^+$ on the positive side where a current rises is larger than an absolute value of the threshold voltage $V_{th}^-$ on the negative side).

In the case of selecting different metals for the two electrodes, when $\eta=0.50$, $E_{F2}-E_{F1}<\Delta_2-\Delta_1$ is required in order not to cancel the rectification. Since $\Delta_2-\Delta_1>0$, $E_{F1}$ and $E_{F2}$ may only be $E_{F2}<E_{F1}$. That is, it is preferable to use, for the second conductive layer 12, a material having a larger work function than that of the first conductive layer 10.

The organic molecular device of the present embodiment can realize highly durable, stable rectification characteristics while having a small size.

Seventh Embodiment

The organic molecular device of the present embodiment is similar to that of the third embodiment except for being provided with two linker moieties of the first linker moiety 20a for bonding the π-conjugated system chain 18 with the first conductive layer 10 and the second linker moiety 20b for bonding the π-conjugated system chain 18 with the second conductive layer 12. Hence descriptions of contents that overlap those of the third embodiment will be omitted.

Figure 21:
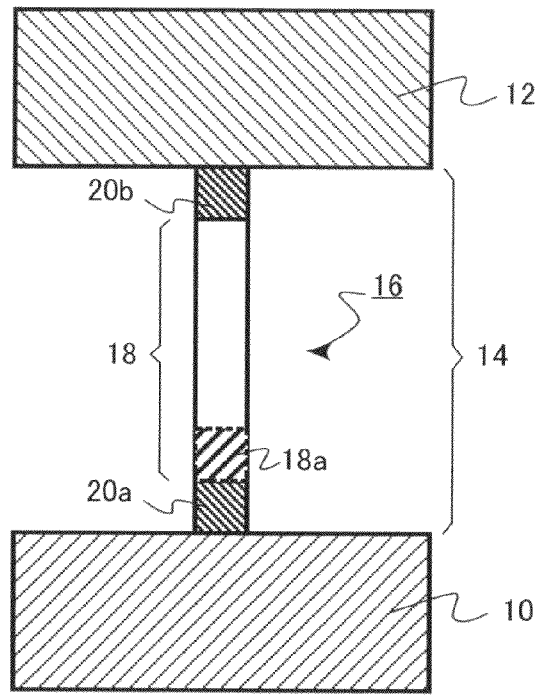
FIG. 21 is a schematic sectional view showing a structure in an organic molecular layer of a seventh embodiment.

FIG. 21 is a schematic sectional view showing a structure in the organic molecular layer of the present embodiment.

The organic molecule 16 is provided with the first linker moiety 20a for binding the π-conjugated system chain 18 to the first conductive layer 10. Further, it is provided with the second linker moiety 20b for binding the π-conjugated system chain 18 to the second conductive layer 12. The first aromatic ring 18a is provided on the first conductive layer 10 side of the π-conjugated system chain 18.

In the organic molecular device of the present embodiment, the organic molecule 16 is fixed to both the first conductive layer 10 and the second conductive layer 12. This thus leads to improvement in durability.

Further, in the present embodiment, from the viewpoint of improving the rectification characteristic of the diode, a work function of the second conductive layer 12 is desirably larger than a work function of the first conductive layer 10.

In the present embodiment, the dipole headed in a direction from the acceptor part 18a to the π-conjugated molecular chain 18 is generated. This leads to realization of the rectification that, when $\Delta_2$ is made large as compared with $\Delta_1$ and a negative potential is applied to the second conductive layer 12 with the first conductive layer 10 taken as a reference, the bias is a forward bias (an absolute value of the threshold voltage $V_{th}^+$ on the positive side where a current rises is larger than an absolute value of the threshold voltage $V_{th}^-$ on the negative side).

In the case of selecting different metals for the two electrodes, when $\eta=0.50$, $E_{F2}-E_{F1}<\Delta_2-\Delta_1$ is required in order not to cancel the rectification. Since $\Delta_2-\Delta_1>0$, $E_{F1}$ and $E_{F2}$ may only be $E_{F2}<E_{F1}$. That is, it is preferable to use, for the second conductive layer 12, a material having a larger work function than that of the first conductive layer 10.

The organic molecular device of the present embodiment can realize highly durable, stable rectification characteristics while having a small size.

Eighth Embodiment

The organic molecular device of the present embodiment is similar to that of the fourth embodiment except for being provided with two linker moieties of the first linker moiety 20a for bonding the π-conjugated system chain 18 with the first conductive layer 10 and the second linker moiety 20b for bonding the π-conjugated system chain 18 with the second conductive layer 12. Hence descriptions of contents that overlap those of the fourth embodiment will be omitted.

Figure 22:
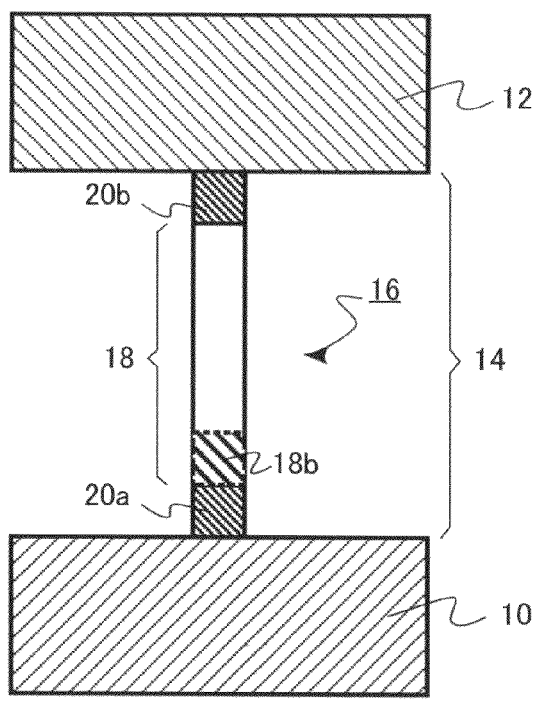
FIG. 22 is a schematic sectional view showing a structure in an organic molecular layer of an eighth embodiment.

FIG. 22 is a schematic sectional view showing a structure in the organic molecular layer of the present embodiment.

The organic molecule 16 is provided with the first linker moiety 20a for binding the π-conjugated system chain 18 to the first conductive layer 10. Further, it is provided with the second linker moiety 20b for binding the π-conjugated system chain 18 to the second conductive layer 12. The second aromatic ring 18b is provided on the first conductive layer 10 side of the π-conjugated system chain 18.

In the organic molecular device of the present embodiment, the organic molecule 16 is fixed to both the first conductive layer 10 and the second conductive layer 12. This thus leads to improvement in durability.

Further, in the present embodiment, from the viewpoint of improving the rectification characteristic of the diode, a work function of the first conductive layer 10 is desirably larger than a work function of the second conductive layer 12.

In the present embodiment, the dipole headed in a direction from the donor part 18b to the π-conjugated molecular chain 18 is generated. This leads to realization of the rectification that, when $\Delta_1$ is made large as compared with $\Delta_2$ and a positive potential is applied to the second conductive layer 12 with the first conductive layer 10 taken as a reference, the bias is a forward bias (an absolute value of the threshold voltage $V_{th}^+$ on the positive side where a current rises is smaller than an absolute value of the threshold voltage $V_{th}^-$ on the negative side).

In the case of selecting different metals for the two electrodes, when $\eta=0.50$, $E_{F1}-E_{F2}<\Delta_1-\Delta_2$ is required in order not to cancel the rectification. Since $\Delta_1-\Delta_2>0$, $E_{F1}$ and $E_{F2}$ may only be $E_{F1}<E_{F2}$. That is, it is preferable to use, for the first conductive layer 10, a material having a larger work function than that of the second conductive layer 12.

Ninth Embodiment

The organic molecular device of the present embodiment is similar to that of the first embodiment except that, in addition to the first embodiment, there are further provided a third conductive layer and a resistance changing layer of a metal oxide provided between the second conductive layer and the third conductive layer. Hence descriptions of contents that overlap those of the first embodiment will be omitted.

Figure 23:
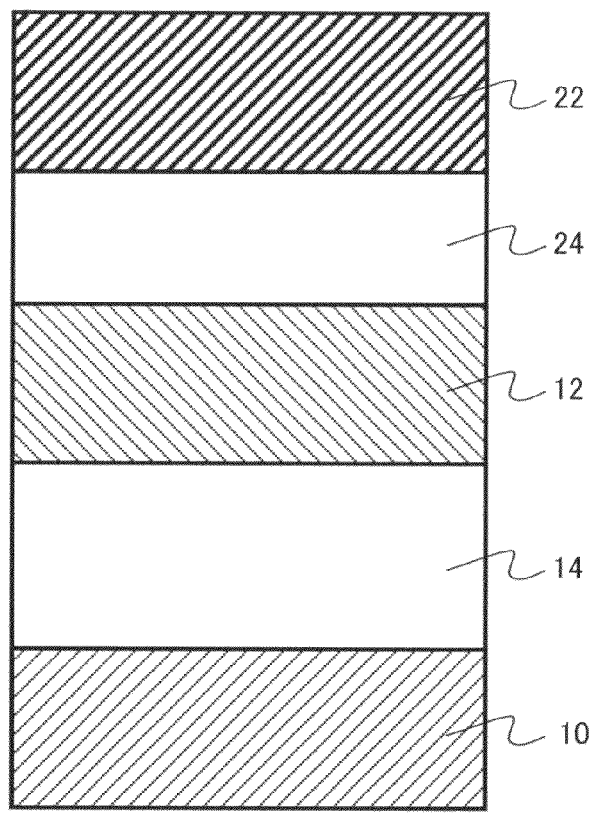
FIG. 23 is a schematic sectional view of an organic molecular device of a ninth embodiment.

FIG. 23 is a schematic sectional view of the organic molecular device of the present embodiment. It is provided with the first conductive layer 10, the second conductive layer 12 and the organic molecular layer 14. The organic molecular layer 14 is provided between the first conductive layer 10 and the second conductive layer 12. Further, a third conductive layer 22 and a metal oxide layer 24 are provided. The metal oxide layer 24 is provided between the second conductive layer 12 and the third conductive layer 22.

The first conductive layer 10, the second conductive layer 12 and the third conductive layer 22 are, for example, electrodes formed of metal. Other than metal, a conductor such as a semiconductor, a metal-semiconductor compound, a metal oxide or the like can be applied. The first conductive layer 10, the second conductive layer 12 and the third conductive layer 22 are, for example, not smaller than 1 nm and not larger than nm both in width and thickness.

The metal oxide layer 24 has a characteristic of changing resistance of the metal oxide layer 24 itself or interface resistance between the metal oxide layer 24 and the first conductive layer 10 or the second conductive layer 12 by voltage application. The metal oxide layer 24 is, for example, hafnium oxide.

The organic molecular device of the present embodiment is applicable, for example, to a unit cell of a ReRAM (Resistance Random Access Memory). According to the present embodiment, the resistance changing material is combined with the molecular diode having a small size and stable rectifying characteristics, thereby to allow scaling-down of the unit cell of the ReRAM. This thus allows realization of a ReRAM with a high integration degree.

Tenth Embodiment

The present embodiment is a logic circuit using any of the diodes of the first to eighth embodiments. Hereinafter, descriptions of contents that overlap those of the first embodiment will be omitted.

Figure 24A:
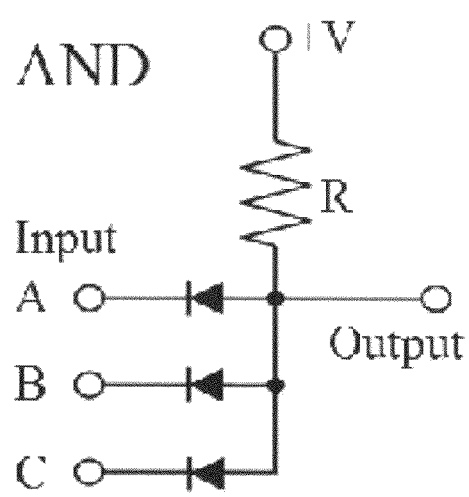
FIGS. 24A and 24B are logic circuits of a tenth embodiment.
Figure 24B:
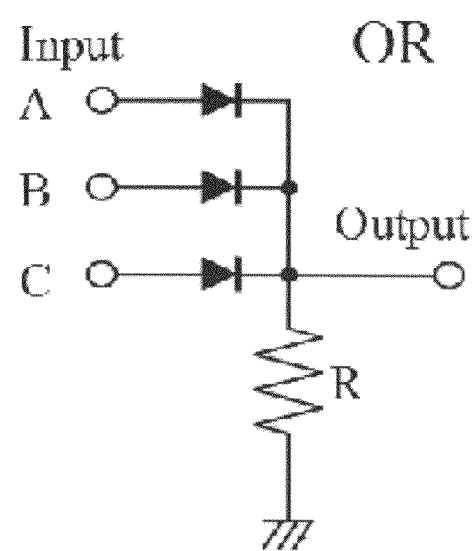

FIGS. 24A and 24B are logic circuits of the present embodiment. It is a DDL (Diode Diode Logic) circuit made up of a diode. FIG. 24A is an AND circuit with three inputs, and FIG. 24B is an OR circuit with three inputs.

The diodes of the first to eighth embodiments each have the property that a threshold voltage with which a current begins to flow varies depending on a sign of a potential that is applied to between the devices. The electrode (i.e., the direction of the device) is re-defined such that a potential with a threshold voltage having a small absolute value becomes a positive potential. Accordingly, in all devices, the relation between a threshold voltage $V_{th}^+$ of the positive voltage and a threshold voltage $V_{th}^-$ of the negative voltage holds as: $|V_{th}^+|<|V_{th}^-|$.

Diode symbols in FIGS. 24A and 24B represent the diodes of the first to eighth embodiments.

In the circuit of FIG. 24A, when an input voltage $V_{in}^A \cdot V_{in}^B \cdot V_{in}^C$ of each of A·B·C is all: $(V-V_{th}^+)<V_{in}^A \cdot V_{in}^B \cdot V_{in}^C<V$, a current does not flow in any of the diodes, and a current I flowing through a resistor R is: I=0, and an output voltage is V.

However, when one or more input voltages out of A·B·C are not larger than $(V-V_{th}^+)$, a current flows. Then, a total current I flows through the resistor, to give rise to a voltage drop IR, and the output voltage becomes V−IR and decreases. Appropriately designing the resistance value and the voltage V can make V−IR not larger than a desired logic threshold voltage $V_L$ ($<V-V_{th}^+$).

When the time when the voltage is not larger than the logic threshold voltage $V_L$ is associated with "0" and the time when the voltage is not smaller than the logic threshold voltage $V_L$ is associated with "1", it is found that this circuit is a circuit to execute a logic operation AND.

In the circuit of FIG. 24B, when the input voltage $V_{in}^A \cdot V_{in}^B \cdot V_{in}^C$ of any of A·B·C is not smaller than $V_{th}^+$, a current flows through the rectification device. Then, the total current I flows through the resistor, to give rise to the voltage drop IR, and the output voltage becomes IR.

When the input voltage $V_{in}^A \cdot V_{in}^B \cdot V_{in}^C$ of each of A·B·C is all: $V_{in}^A \cdot V_{in}^B \cdot V_{in}^C<V_{th}^+$, a current does not flow in any of the diodes. For this reason, the current I flowing through the resistor R is: I=0, and an output voltage is 0. Appropriately designing the resistance value and the voltage V can make IR not smaller than the desired logic threshold voltage $V_L$.

When the time when the voltage is not larger than the logic threshold voltage $V_L$ is associated with "0" and the time when the voltage is not smaller than the logic threshold voltage $V_L$ is associated with "1", it is found that this circuit is a circuit to execute a logic operation OR.

According to the present embodiment, the molecular diode having a small size and stable rectifying characteristics is used, thereby to allow realization of a fine, stable DDL circuit.

Eleventh Embodiment

An organic molecular device of an embodiment includes a first conductive layer, a second conductive layer, and an organic molecular layer provided between the first conductive layer and the second conductive layer. The organic molecular layer has an organic molecule including a one-dimensional or quasi one-dimensional π-conjugated system chain. The π-conjugated system chain has either a first aromatic ring or a second aromatic ring. The first aromatic ring has one or more substituents that are an electron withdrawing group, each substituent of the first aromatic ring is independently selected from the group consisting of the electron withdrawing group and hydrogen, and the electron withdrawing group of the first aromatic ring is arranged symmetrically about a line through a bonding direction of the π-conjugated system chains. The second aromatic ring has one or more substituents that are an electron releasing group, and each substituent of the second aromatic ring is independently selected from the group consisting of the electron releasing group and hydrogen, and the electron releasing group of the second aromatic ring is arranged symmetrically about the line through the bonding direction of the π-conjugated system chains. The first aromatic ring or the second aromatic ring exist in an unbalanced manner in the π-conjugated system chain, the π-conjugated system chain having a resistance change-type molecular chain including an electron withdrawing group or an electron releasing group arranged asymmetrically about the line through the bonding direction of the π-conjugated system chain.

The organic molecular device of the present embodiment functions as an organic molecular memory by adding a resistance change-type molecular chain to the organic molecule of each of the first to the eighth embodiments. This is similar to the first to the eighth embodiments except for the resistance change-type molecular chain. Hence descriptions of contents that overlap those of the first to eighth embodiments may be omitted.

Figure 25:
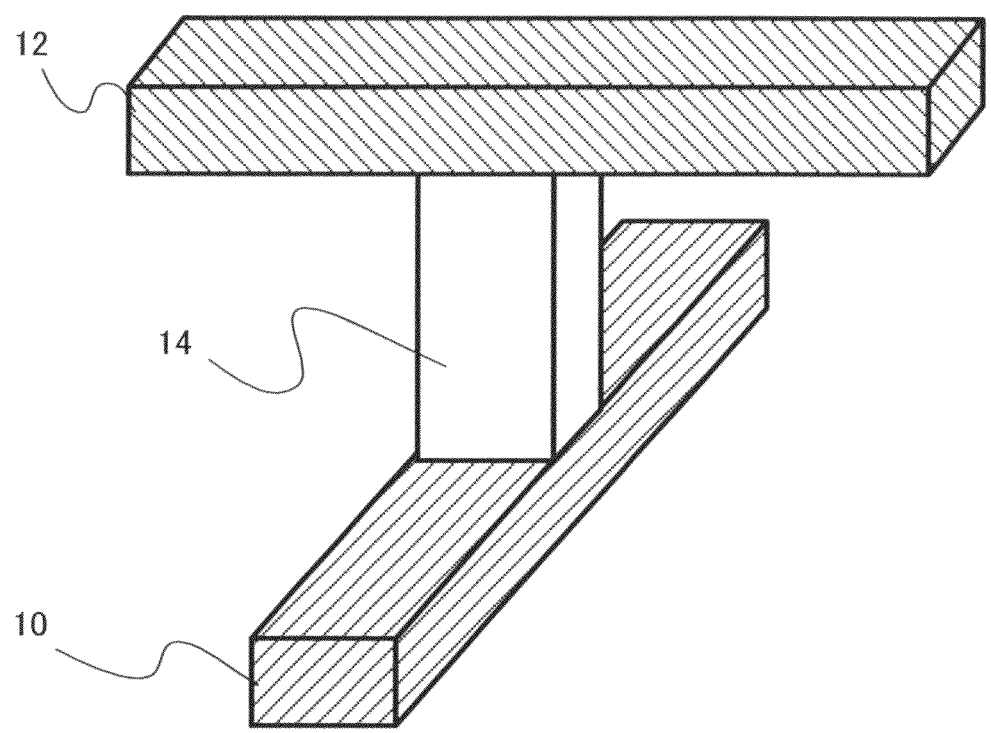
FIG. 25 is a schematic perspective view of an organic molecular memory of an eleventh embodiment.

FIG. 25 is a schematic perspective view of the organic molecular memory of the present embodiment. The molecular memory of the present embodiment is a cross point-type molecular memory. As shown in FIG. 25, lower-electrode wiring (first conductive layer) 10 is provided which is arranged on the top of a substrate (not shown). Then, upper electrode wiring (second conductive layer) 12 is provided so as to intersect with the lower electrode wiring 10. A design rule of the electrode wiring is, for example, on the order of 5 to 20 nm.

As shown in FIG. 25, the organic molecular layer 14 is provided between the lower electrode wiring 10 and the upper electrode wiring 12, in an intersecting part of the lower electrode wiring 10 and the upper electrode wiring 12. A plurality of organic molecules constitutes the organic molecular layer 14. A thickness of the organic molecular layer 14 is, for example, not smaller than 1 nm and not larger than nm.

Then, for example, at each of points where the plurality of lower electrode wiring 10 intersect with the plurality of upper electrode wiring 12, the organic molecular layer 14 is provided to form a memory cell, as in FIG. 25. In such a manner, a memory cell array made up of a plurality of memory cells is realized.

Figure 26:
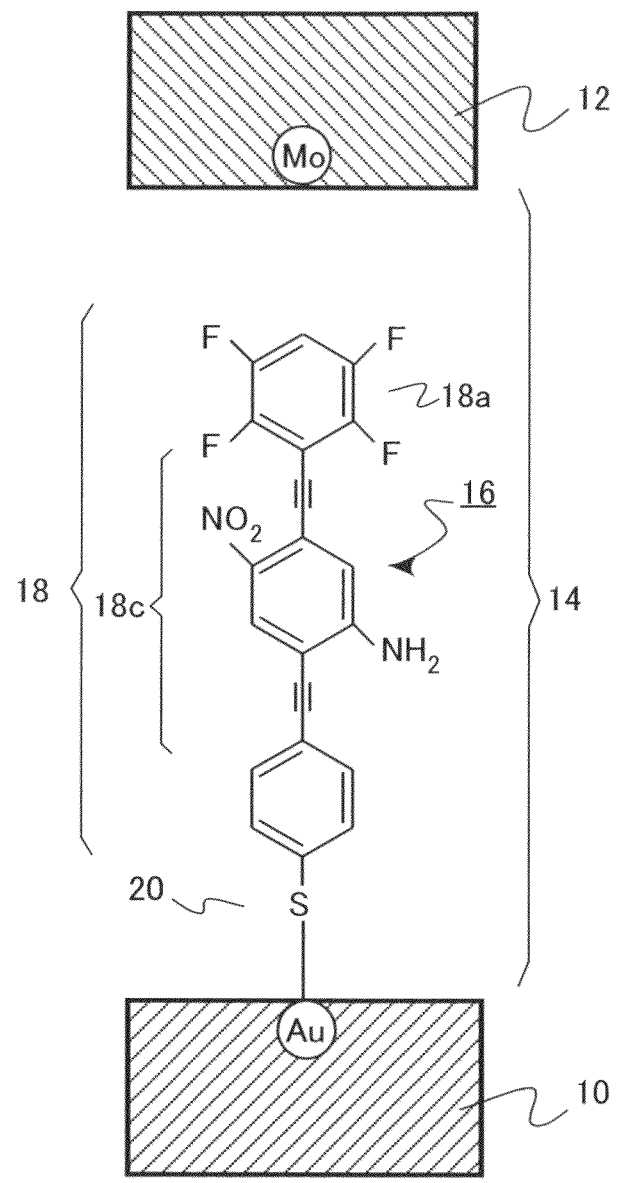
FIG. 26 is a schematic sectional view showing a specific example of an organic molecular device of the eleventh embodiment.

FIG. 26 is a schematic sectional view showing a specific example of the organic molecular device of the present embodiment. The first conductive layer 10 as a lower electrode is, for example, gold (Au). Further, the second conductive layer 12 as an upper electrode is, for example, molybdenum (Mo).

The organic molecule 16 is provided with the π-conjugated system chain 18 where three phenyl rings are bonded by single bonds. A thiol group exists as the linker moiety 20 at one end of the π-conjugated system chain 18, and a sulfur atom (S) is chemically bonded with a gold atom (Au) on the surface of the first conductive layer 10.

The phenyl ring at the end on the second conductive layer 12 side of the three phenyl rings is bonded with four fluorine atoms (F) as the electron withdrawing group. This phenyl ring at the end in the chain corresponds to the aromatic ring (first aromatic ring) 18a bonded only with the electron withdrawing group.

Moreover, the phenyl ring at the center out of the three phenyl rings is interposed between carbon bonds of "single bond-triple bond-single bond", and a nitro group is bonded with an amino group. The carbon bonds of "single bond-triple bond-single bond" at both ends and the phenyl ring therebetween correspond to a resistance change-type molecular chain 18c.

The organic molecule 16 is provided with the aromatic ring (first aromatic ring) 18a of the π-conjugated system chain 18 bonded only with the electron withdrawing group and the resistance change-type molecular chain 18c, and the first aromatic ring 18a exists in an unbalanced manner in the π-conjugated system chain. With this configuration, the organic molecule 16 is provided with both a resistance changing function by voltage application and the rectification characteristic.

The molecular structure of the organic molecule 16 is not restricted to the structure of FIG. 26. A basic molecular structure of the π-conjugated system chain 18 can, for example, be the structure shown in each of FIGS. 4A to 4F.

For example, part of the aromatic ring in the π-conjugated system chain 18 shown in each of FIGS. 4A to 4F is bonded with the electron withdrawing group, to give the first aromatic ring (electron withdrawing part A) 18a.

The number of carbon atoms in the π-conjugated system chain 18 which are one-dimensionally bonded by alternate single bonds and double bonds or triple bonds is desirably not smaller than 12 and not larger than 40. The number of carbon atoms in the π-conjugated system chain 18 being one-dimensionally bonded by alternate single bonds and double bonds or by alternate single bonds and triple bonds is desirably not smaller than 12 and not larger than 40. When the number of carbon atoms is smaller than 12, carriers flow in the organic molecule 16 by tunneling, which might cause the rectification characteristic not to occur. When the number of carbon atoms is larger than 40, the electric current flowing through this device decreases, because the carrier transit time of the molecule become longer.

From the viewpoints of the stability and production easiness of the organic molecule 16, the π-conjugated system chain 18 is preferably made up of the phenyl ring. Further, from the viewpoint of realizing a proper rectification characteristic and a proper current amount, the number of phenyl rings is desirably not smaller than three and not larger than five.

As for the molecular structure of the aromatic ring (electron withdrawing part) 18a bonded only with the electron withdrawing group, for example, the structures shown in FIGS. 5A to 5E are applicable. In the figures, $X_A$ is, for example, a fluorine atom (F), a chloride atom (Cl), a bromine atom (Br), a nitro group, a cyano group, a hydroxyl group, a carbonyl group or a carboxyl group. From the viewpoint of forming the organic molecule 16 with a stable structure, it is desirably the fluorine atom (F).

In the present embodiment, the aromatic ring 18a bonded only with the electron withdrawing group exists in an unbalanced manner in the π-conjugated system chain 18. Here, "the aromatic ring 18a exists in an unbalanced manner in the π-conjugated system chain 18" means that the aromatic ring $18a$ is arranged in an unbalanced manner with respect to a center position of a longitudinal direction of the π-conjugated system chain 18.

In the aromatic ring $18a$ bonded only with the electron withdrawing group, the electron withdrawing group is arranged line-symmetrically with the bonding direction of the π-conjugated system chains 18. The bonding direction of the π-conjugated system chain 18 is the extending direction of the main chain of the π-conjugated system chain 18. For example, in FIG. 26, a direction of a σ bond in "single bond-triple bond-single bond" bonded to the aromatic ring $18a$ is the above bonding direction. For example, in the aromatic ring $18a$ of FIG. 26, four fluorine atoms are arranged line-symmetrically with the bonding direction.

The resistance change-type molecular chain $18c$ is not particularly restrictive so long as being a molecular chain which possesses the function of changing resistance by voltage application. In order to possess the function of changing resistance, the resistance change-type molecular chain $18c$ includes the electron withdrawing group or the electron releasing group arranged not line-symmetrically with the bonding direction of the π-conjugated system chain 18.

The resistance change-type molecular chain has a structure having phenyl rings alternating between either or both of carbon-carbon double bonds or carbon-carbon triple bonds, wherein the phenyl rings have an electron withdrawing group or an electron releasing group. The resistance change-type molecular chain $18c$ is desirably a phenyl ring interposed between carbon bonds of "single bond-double bond" or "triple bond-single bond", and provided with the electron withdrawing group or the electron releasing group, from the viewpoints of the stability of the structure, the resistance change characteristics, and the production easiness.

It is to be noted that the bonding direction of the π-conjugated system chain 18 is the extending direction of the main chain of the π-conjugated system chain 18. For example, in FIG. 26, a direction of a σ bond in "single bond-triple bond-single bond" of the resistance change-type molecular chain $18c$ is the above bonding direction. For example, in FIG. 26, only one nitro group as the electron withdrawing group exists in the side chain. Therefore, the nitro group as the electron withdrawing group is arranged not line-symmetrically with the bonding direction of the π-conjugated system chain 18. Further, in FIG. 26, only one amino group as the electron releasing group exists in the side chain. Therefore, the amino group as the electron releasing group is arranged not line-symmetrically with the bonding direction of the π-conjugated system chain 18.

Molecular Formula 1 and Molecular Formula 2 are formulas exemplifying a molecular structure of the resistance change-type molecular chain $18c$.

[Molecular Formula 1]

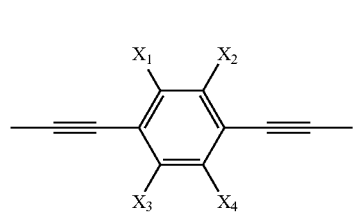

[Molecular Formula 2]

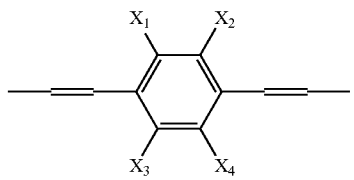

In Molecular Formula 1 and Molecular Formula 2, $X_1$, $X_2$, $X_3$ and $X_4$ are substituent groups shown in Table 1 below.

TABLE 1

| $X_1$ | $X_2$ | $X_3$ | $X_4$ |
| --- | --- | --- | --- |
| Y | H | H | Z |
| Y | H | H | Y |
| Y | H | Z | H |
| H | Y | H | Z |

In Table 1, H is hydrogen, and Y and Z are each, independently, selected from the group consisting of a fluoro group, a chloro group, a bromo group, a nitro group, a cyano group, a hydroxyl group, a carbonyl group, a carboxyl group and an amino group.

From the viewpoint of reducing a reset current of a resistance value of the organic molecule 16, the structure of Molecular Formula 1 where the phenyl ring is interposed between carbon bonds of "single bond-triple bond-single bond" is desired.

Further, from the viewpoint of increasing an amount of change in resistance of the organic molecule 16, one phenyl ring is desirably bonded with both the electron withdrawing group and the electron releasing group.

Molecular Formula 3 is a formula exemplifying the molecular structure of the resistance change-type molecular chain $18c$. As in Molecular Formula 3, the resistance change-type molecular chain $18c$ can also be made up of two phenyl rings.

[Molecular Formula 3]

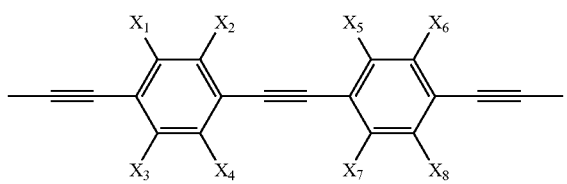

In Molecular Formula 3, $X_1$, $X_2$, $X_3$, $X_4$, $X_5$, $X_6$, $X_7$ and $X_8$ are substituent groups shown in Table 2 below.

TABLE 2

| $X_1$ | $X_2$ | $X_3$ | $X_4$ | $X_5$ | $X_6$ | $X_7$ | $X_8$ |
| --- | --- | --- | --- | --- | --- | --- | --- |
| Y | H | H | Z | H | H | H | H |
| Y | H | H | Y | H | H | H | H |
| Y | H | Z | H | H | H | H | H |
| Y | H | Y | H | H | H | H | H |
| H | Y | H | Z | H | H | H | H |
| H | H | H | H | Y | H | H | Z |

In Table 2, H is hydrogen, and Y and Z are each, independently, selected from the group consisting of a fluoro group, a chloro group, a bromo group, a nitro group, a cyano group, a hydroxyl group, a carbonyl group, a carboxyl group and an amino group.

Here, the explanation has been given by taking as an example the case where the organic molecule 16 is provided with the first aromatic ring 18a bonded only with the electron withdrawing group, but it can also be configured to be provided with the second aromatic ring 18b bonded only with the electron releasing group. Further, the positional relation between the first aromatic ring 18a or the second aromatic ring 18b and the resistance change-type molecular chain 18c in the π-conjugated system chain 18 is also not restrictive so long as the unbalanced existence of the first aromatic ring 18a or the second aromatic ring 18b is ensured in the π-conjugated system chain 18. Moreover, the π-conjugated system chain 18 may be in the form of being provided with two linker moieties and bonded with both the first conductive layer 10 and the second conductive layer 12.

According to the present embodiment, stable rectification characteristics and resistance changing characteristics can be realized with single organic molecule having a small size. This thus allows realization of a high-density organic molecular memory.

In the following, an example will be described.

EXAMPLE

Figure 27:
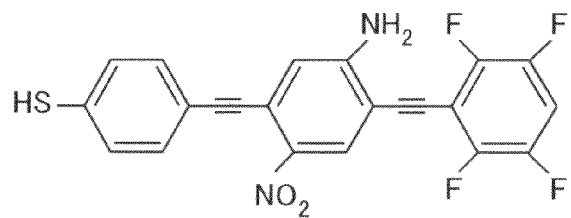
FIG. 27 is a diagram showing a molecular structure of an organic molecule in an example.

FIG. 27 is a diagram showing a molecular structure of an organic molecule in the example. Dipoles of this organic molecule were calculated by the molecular orbital calculation program Gaussian. The calculation by Gaussian is performed by a DFT (Density Functional Theory) method using B3LYP1 and taking 6-31G* as a basic function.

As a result of the calculation, it became clear that there exist dipoles of the organic molecule which are: a dipole as a sum of vectors of a nitro-group dipole (α) in a direction from the nitrogen atom to the carbon atom, with a size of 4.22 (Debye), and an amino-group dipole (α) in a direction from the carbon atom to the nitrogen atom, with a size of 2.25 (Debye); and a dipole (γ) in a direction of the main chain from a phenyl group bonded with fluorine to a phenyl group on the opposite side, with a size of 2.90 (Debye). Further, a HOMO level of the molecule was 5.79 (eV) and the main chain of the π-conjugated chain was: η=0.50.

Figure 28:
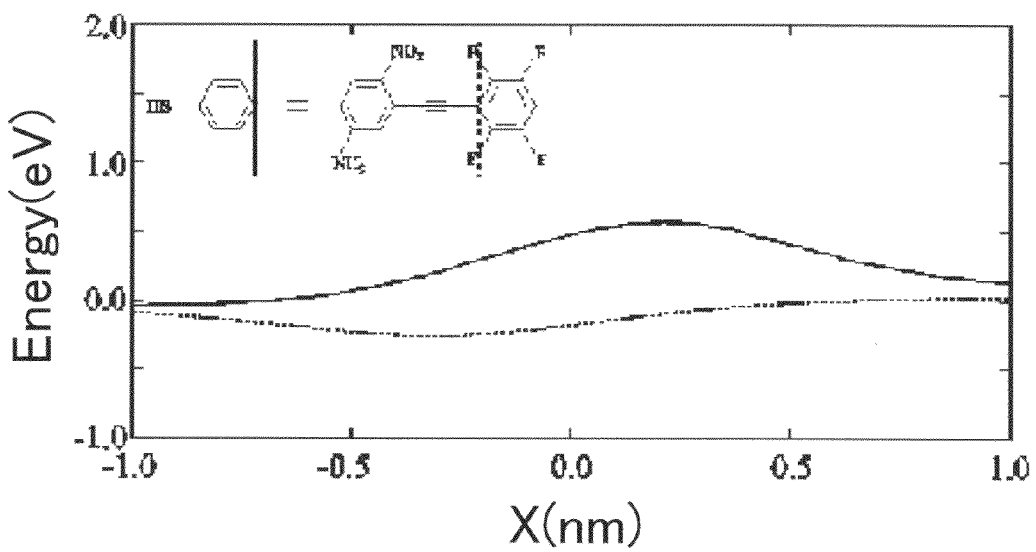
FIG. 28 is a result of calculation of a potential of the organic molecule in the example.

FIG. 28 is a result of calculation of a potential of the organic molecule in the example. It is assumed that the organic molecule is a planar molecule with π-conjugation taken as a skeleton, and stands along a vertical direction to metal of the substrate, namely a z-axis. A bonded point of the substrate and the organic molecule is taken as an origin, and an x-axis is taken such that a plain including this organic molecule is an x-z plane. From this coordinate, a potential was calculated by the above-mentioned image force method.

FIG. 28 shows a distance x from a molecular axis with respect to dependency in terms of a potential of a portion cut on a plane orthogonal to the molecular axis at a cut-off distance of one phenyl group and including a π electron of the organic molecule. Since a charge is injected along the molecular axis, a potential of x=0 becomes activation energy.

From FIG. 28, $\Delta_1$=0.48 (eV), and $\Delta_2$=0.00 (eV). Therefore, a voltage at which a current rises in use of an Au (111) substrate with a work function $E_F$ of 5.27 (eV) is $V_{th}^-$ (negative bias side)=−2.00 (V), and $V_{th}^+$ (positive bias side)=1.04 (V).

Figure 29:
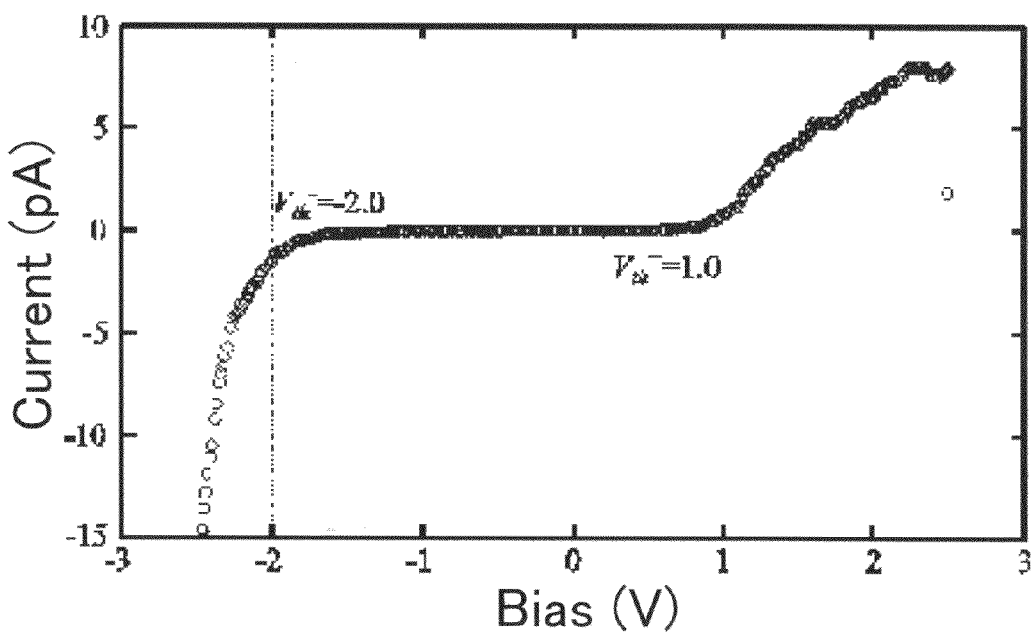
FIG. 29 is a diagram showing a current-voltage characteristic of the organic molecule in the example.

FIG. 29 is a diagram showing a current-voltage characteristic of the organic molecule in the example. The figure shows a result of actually measuring, by STS (Scanning Tunneling Spectroscopy), a current-voltage characteristic of 4-[2-amino-5-nitro-4-(2,3,5,6-tetrafluoro-phenylethynyl)phenyl-ethynyl]benzenethiol module formed on the Au(111) substrate. Further, the figure also shows $V_{th}^-$ and $V_{th}^+$ obtained by calculation. The actual measurement agrees well with the measurement result, proving that the above argument is correct. The rectification parameter is: ξ=0.66, showing excellent rectification.

It is known that an actual energy level spreads by a thermal effect. For example, when a temperature is T and a Boltzmann's constant is k, it has a spread on the order of ±8 kT/e (eV). That is, on an actual use condition T of 300 (K), it has a spread on the order of ±0.21 (eV). Considering this spread, when the forward direction is a positive voltage, $$-V_{th}^- + 0.21 > V_{th}^+ - 0.21$$

should hold.

When the forward direction is a negative voltage, $$V_{th}^+ + 0.21 > -V_{th}^+ - 0.21$$

should hold.

It is preferable therefrom that a difference in absolute value between $V_{th}^-$ and $V_{th}^+$ of the organic molecule is not smaller than 0.42 (V).

In the organic molecule of the example, the forward direction is the positive voltage, and thus satisfies the above condition. Hence it can be said to show excellent rectification even when variations are considered.

COMPARATIVE EXAMPLE

Figure 30:
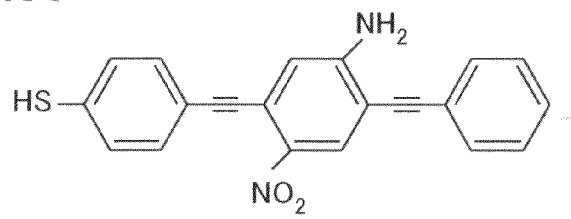
FIG. 30 is a diagram showing a molecular structure of an organic molecule in a comparative example.

FIG. 30 is a diagram showing a molecular structure of an organic molecule in a comparative example. By calculation by Gaussian as in the example, it is confirmed that a dipole of the organic molecule is equal to a sum of vectors of dipoles of the nitro group and the amino group. A nitro-group dipole (α) bonded to the phenyl ring is in the direction from the nitrogen atom to the carbon atom, with a size of 4.22 (Debye), and an amino-group dipole (β) in the direction of the carbon atom to the nitrogen atom, with a size of 2.25 (Debye). Further, a HOMO level of the molecule was 5.78 (eV) and the main chain of the π-conjugated chain was: η=0.50.

Figure 31:
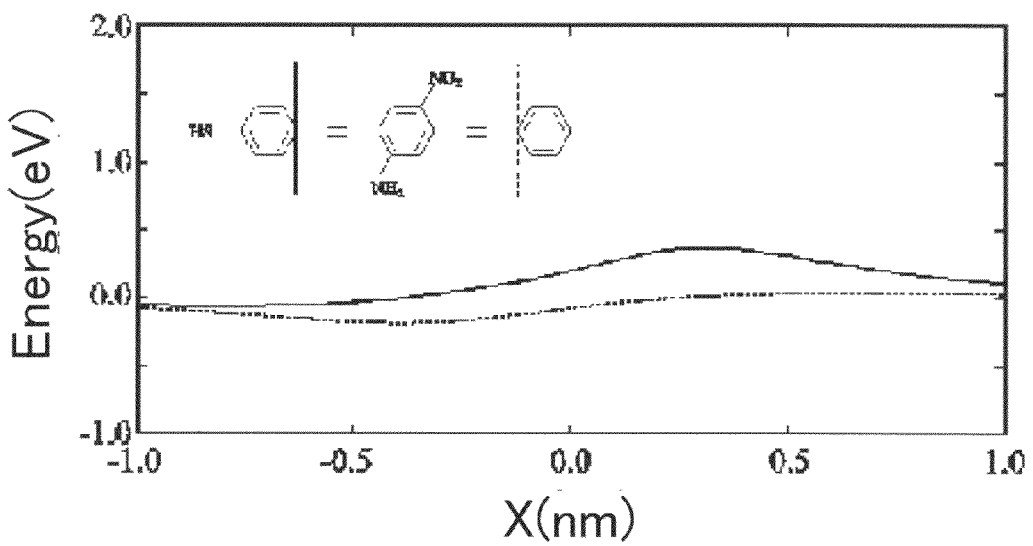
FIG. 31 is a result of calculation of a potential of the organic molecule in the comparative example.

FIG. 31 is a result of calculation of a potential of the organic molecule in the comparative example. It is assumed that the organic molecule is a planar molecule with π-conjugation taken as a skeleton, and stands along a vertical direction to metal of the substrate, namely a z-axis. A bonded point of the substrate and the organic molecule is taken as an origin, and an x-axis is taken such that a plain including this organic molecule is an x-z plane. From this coordinate, a potential was calculated by the above-mentioned image force method.

FIG. 31 shows a distance x from a molecular axis with respect to dependency in terms of a potential of a portion cut on a plane orthogonal to the molecular axis at a cut-off distance of one phenyl group and including a π electron of the organic molecule. Since a charge is injected along the molecular axis, a potential of x=0 becomes activation energy.

The contribution to the potential by the nitro group and the amino group in the side chains of the phenyl group at the center is small. These donor and acceptor substituent groups each have a small component of the dipole in the direction of the main chain. Further, the dipole does not exist on the conduction path and is thus distant from the carrier. Therefore, since the contribution to the potential by the donor and acceptor groups is small, $\Delta_1$ and $\Delta_2$ are small as compared with those in the example.

From FIG. 31, $\Delta_1$=0.17 (eV), and $\Delta_2$=0.00 (eV). Therefore, a voltage at which a current rises in use of the Au(111)

substrate with a work function $E_F$ of 5.27 (eV) is $V_{th}^-$ (negative bias side)=−1.34 (V), and $V_{th}^+$ (positive bias side)=1.02 (V).

Figure 32:
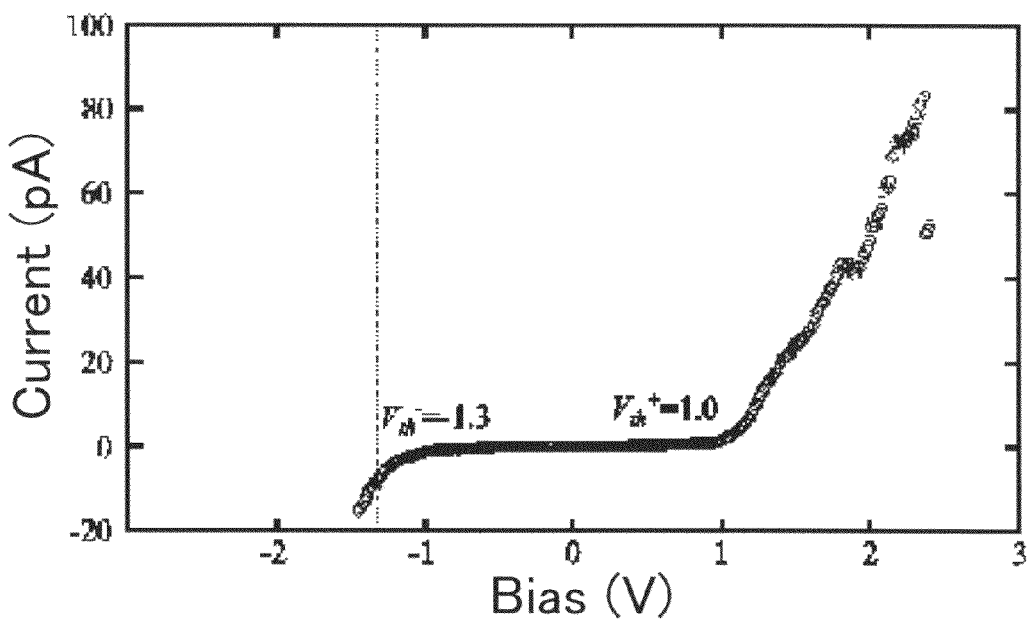
FIG. 32 is a diagram showing a current-voltage characteristic of the organic molecule in the comparative example.

FIG. 32 is a diagram showing a current-voltage characteristic of the organic molecule in the comparative example. The figure shows a result of actually measuring, by STS, a current-voltage characteristic of 4-[2-amino-5-nitro-4-(phenylethynyl)phenylethynyl]benzenethiol module formed on the Au(111) substrate. Further, the figure also shows $V_{th}^-$ and $V_{th}^+$ obtained by calculation. The actual measurement agrees well with the measurement result, proving that the above argument is correct. The rectification parameter is: $\xi=0.57$, showing weak rectification.

However, a difference in absolute value between $V_{th}^-$ and $V_{th}^+$ is not larger than 0.42 (V). In the case of considering the energy level spreading effect due to heat, it is not possible to obtain stable rectification, namely rectification which is constantly realized even when variations in characteristics are considered, and hence it cannot be said that practical rectification is obtained.

In the case of the comparative example, in order that the difference in absolute value between $V_{th}^-$ and $V_{th}^+$ is not smaller than 0.42 (V), $\Delta_1>0.21$ (eV) need to hold. When $\Delta_1=0.21$ (eV), a voltage at which a current rises is $V_{th}^-$ (negative bias side)=−1.44 (V), and $V_{th}^+$ (positive bias side)=1.02 (V). In this case, the rectification parameter is: $\xi=0.59$. Accordingly, in order to obtain stable rectification even in consideration of variations, it is desirable that the property parameter is: $\xi>0.6$ when the positive bias side is the forward direction. Similarly it is desirable that the property parameter is: $\xi<0.4$ when the negative bias side is the forward direction.

In comparative example, weak rectification exists with an effect of dipole due to the phenyl ring at the center, but since $\Delta_1$ and $\Delta_2$ were small, stable characteristics could not be obtained with a thermal effect taken into consideration. It became obvious that as in the example, introducing the donor part or the acceptor part for modulating a density of the π electron to the main chain allows realization of excellent rectification.

While certain embodiments and examples have been described, these embodiments and examples have been presented byway of example only, and are not intended to limit the scope of the inventions. Indeed, organic molecular device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular device, comprising:
   a first conductive layer;
   a second conductive layer; and
   an organic molecular layer provided between the first conductive layer and the second conductive layer, the organic molecular layer having an organic molecule, the organic molecule including a one-dimensional or quasi one-dimensional π-conjugated system chain,
   wherein the π-conjugated system chain has either a first aromatic ring or a second aromatic ring,
   wherein the first aromatic ring has one or more substituents that are an electron withdrawing group, each substituent of the first aromatic ring is independently selected from the group consisting of the electron withdrawing group and hydrogen, the second aromatic ring has one or more substituents that are an electron releasing group, and each substituent of the second aromatic ring is independently selected from the group consisting of the electron releasing group and hydrogen,
   wherein the first aromatic ring or the second aromatic ring exist in an unbalanced manner in the π-conjugated system chain.

2. The device according to claim 1, wherein the number of carbon atoms in the π-conjugated system chain being one-dimensionally bonded by alternate single bonds and double bonds is not smaller than 12 and not larger than 40.

3. The device according to claim 1, wherein the first aromatic ring and the second aromatic ring are phenyl rings.

4. The device according to claim 1, wherein the electron withdrawing group of the first aromatic ring is a fluorine atom (F), a chloride atom (Cl), a bromine atom (Br), a nitro group, a cyano group, a hydroxyl group, a carbonyl group, or a carboxyl group.

5. The device according to claim 1, wherein the electron releasing group of the second aromatic ring is an amino group.

6. The device according to claim 1, wherein the organic molecule is bound to the first conductive layer or the second conductive layer.

7. The device according to claim 6, wherein the organic molecule is bound to the first or second conductive layer via a linker moiety.

8. The device according to claim 1, wherein
   the π-conjugated system chain has not less than three and not more than five phenyl rings, and
   one of the phenyl rings at one end of the π-conjugated system chain is the first aromatic ring or the second aromatic ring.

9. The device according to claim 7, wherein the linker moiety is a thiol group, an alcohol group, a carboxyl group, a phosphate group, or a silanol group.

10. The device according to claim 1, wherein the electron withdrawing group of the first aromatic ring is arranged symmetrically about a line through a bonding direction of the π-conjugated system chain.

11. The device according to claim 1, further comprising:
    a third conductive layer; and
    a resistance changing layer provided between the second conductive layer and the third conductive layer, the resistance changing layer having a metal oxide.

12. An organic molecular device, comprising:
    a first conductive layer;
    a second conductive layer; and
    an organic molecular layer provided between the first conductive layer and the second conductive layer, the organic molecular layer having an organic molecule, the organic molecule including a one-dimensional or quasi one-dimensional π-conjugated system chain,
    wherein the π-conjugated system chain has either a first aromatic ring or a second aromatic ring,
    wherein the first aromatic ring has one or more substituents that are an electron withdrawing group, each substituent of the first aromatic ring is independently selected from the group consisting of the electron withdrawing group and hydrogen, and the electron withdrawing group of the first aromatic ring is arranged symmetrically about a line through a bonding direction of the π-conjugated system chains,
    wherein the second aromatic ring has one or more substituents that are an electron releasing group, and each substituent of the second aromatic ring is independently selected from the group consisting of the electron releasing group and hydrogen, and the electron releasing group of the second aromatic ring is arranged symmetrically about the line through the bonding direction of the π-conjugated system chains, wherein the first aromatic ring or the second aromatic ring exist in an unbalanced manner in the π-conjugated system chain, the π-conjugated system chain having a resistance change-type molecular chain including an electron withdrawing group or an electron releasing group arranged asymmetrically about the line through the bonding direction of the π-conjugated system chain.

13. The device according to claim 12, wherein the number of carbon atoms in the π-conjugated system chain being one-dimensionally bonded by alternate single bonds and double bonds or by alternate single bonds and triple bonds is not smaller than 12 and not larger than 40.

14. The device according to claim 12, wherein the first aromatic ring and the second aromatic ring are phenyl rings.

15. The device according to claim 12, wherein the electron withdrawing group of the first aromatic ring is a fluorine atom (F), a chloride atom (Cl), a bromine atom (Br), a nitro group, a cyano group, a hydroxyl group, a carbonyl group, or a carboxyl group.

16. The device according to claim 12, wherein the electron releasing group of the second aromatic ring is an amino group.

17. The device according to claim 12, wherein the π-conjugated system chain has a structure having phenyl rings alternating between either or both of carbon-carbon double bonds or carbon-carbon triple bonds, wherein the resistance change-type molecular chain has a phenyl ring having an electron withdrawing group or an electron releasing group.

18. The device according to claim 12, wherein the resistance change-type molecular chain has a structure shown in Molecular Formula 1:

[Molecular Formula 1]

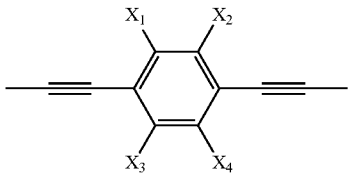

where $X_1$, $X_2$, $X_3$ and $X_4$ are substituent groups shown in Table 1 below:

TABLE 1

| $X_1$ | $X_2$ | $X_3$ | $X_4$ |
|---|---|---|---|
| Y | H | H | Z |
| Y | H | H | Y |
| Y | H | Z | H |
| H | Y | H | Z | where H is hydrogen, and Y and Z are each, independently, selected from the group consisting of a fluoro group, a chloro group, a bromo group, a nitro group, a cyano group, a hydroxyl group, a carbonyl group, a carboxyl group and an amino group.

19. The device according to claim 12, wherein the organic molecule is bound to the first conductive layer or the second conductive layer.

20. The device according to claim 19, wherein the organic molecule is bound to the first or second conductive layer via a linker moiety.

21. The device according to claim 12, wherein the π-conjugated system chain has not less than three and not more than five phenyl rings, and one of the phenyl rings at one end of the π-conjugated system chain is the first aromatic ring or the second aromatic ring.

22. The device according to claim 19, wherein the linker moiety is a thiol group, an alcohol group, a carboxyl group, a phosphate group, or a silanol group.

* * * * *